United States Patent [19]

Yamazaki

[11] Patent Number: 4,984,034
[45] Date of Patent: Jan. 8, 1991

[54] NON-SINGLE-CRYSTALLINE LIGHT EMITTING SEMICONDUCTOR DEVICE MATRIX WITH INSULATION

[75] Inventor: Shunpei Yamazaki, Tokyo, Japan

[73] Assignee: Semiconductor Energy Laboratory Co., Ltd., Atsugi, Japan

[21] Appl. No.: 281,957

[22] Filed: Dec. 5, 1988

Related U.S. Application Data

[60] Continuation of Ser. No. 14,184, Feb. 11, 1987, abandoned, which is a division of Ser. No. 742,700, Jun. 7, 1985, abandoned, which is a division of Ser. No. 347,359, Feb. 9, 1982, Pat. No. 4,527,179.

[30] Foreign Application Priority Data

Feb. 9, 1981 [JP] Japan ................................. 56-18420
Feb. 13, 1981 [JP] Japan ................................ 56-19900

[51] Int. Cl.[5] ............................................. H01L 33/00
[52] U.S. Cl. ............................................. 357/17; 357/2; 357/58; 357/59; 357/16; 357/4
[58] Field of Search .................... 357/2, 63, 17, 58, 32, 357/4, 31, 59 C, 59 D, 30 D, 30 G, 30 H, 30 K, 30 P, 30 Q, 16, 49, 45

[56] References Cited

U.S. PATENT DOCUMENTS

| | | |
|---|---|---|
| 3,500,448 | 3/1970 | Forlani et al. ................. 357/32 X |
| 4,194,935 | 3/1980 | Dingle et al. ................. 357/16 X |
| 4,217,374 | 8/1980 | Ovshinsky et al. ............. 357/2 X |
| 4,226,898 | 10/1980 | Ovshinsky et al. ............. 357/2 X |
| 4,251,287 | 2/1981 | Dalal ........................... 357/2 X |
| 4,275,403 | 6/1981 | Lebailly ......................... 357/17 |
| 4,361,887 | 11/1982 | Nakamura et al. ............ 357/17 X |
| 4,369,372 | 1/1983 | Yoshioka et al. ............. 357/32 X |
| 4,377,818 | 3/1983 | Kuo et al. ..................... 357/45 X |
| 4,384,299 | 5/1983 | Raffel et al. .................. 357/45 X |
| 4,405,915 | 9/1983 | Komatsu et al. .............. 357/30 K |
| 4,407,710 | 10/1983 | Moustakas et al. ............ 357/2 X |
| 4,409,605 | 10/1983 | Ovshinsky et al. .............. 357/2 |
| 4,527,179 | 7/1985 | Yamazaki ...................... 357/17 |

FOREIGN PATENT DOCUMENTS

| | | | |
|---|---|---|---|
| 1564424 | 2/1979 | Fed. Rep. of Germany ... 357/17 X |
| 2755433 | 6/1979 | Fed. Rep. of Germany ... 357/17 X |
| 55-29155 | 3/1980 | Japan ............................ 357/2 |
| 60-115272 | 6/1985 | Japan ........................ 357/17 X |

OTHER PUBLICATIONS

Blum et al, "Formation of Integrated Arrays Having Active Devices and LED's," *IBM Tech. Discl. Bull.*, vol. 15, No. 2, Jul. 1972, 441–442.

*Primary Examiner*—William A. Mintel
*Attorney, Agent, or Firm*—Sixbey, Friedman, Leedom & Ferguson

[57] ABSTRACT

A light emitting semiconductor device which is provided with a first non-single-crystal semiconductor layer, a second non-single-crystal semiconductor layer formed on the first semiconductor layer and a third non-single-crystal semiconductor layer formed on the second semiconductor layer, or a first non-single-crystal semiconductor layer, many second non-single-crystal semiconductor layers formed on the first semiconductor layer and a third non-single-crystal semiconductor layer formed on the first semiconductor layer to cover the second semiconductor layers. The first and second semiconductor layers have either one and the other of p and n conductivity types, respectively. Semiconductors of the first, second and third layers are each doped with a dangling bond and recombination center neutralizer. The semiconductor of the second layer has a smaller energy gap than the semiconductors of the first and third layers.

9 Claims, 32 Drawing Sheets

Fig. 2J  Fig. 2K  Fig. 2L
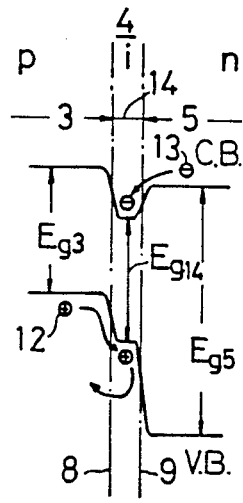 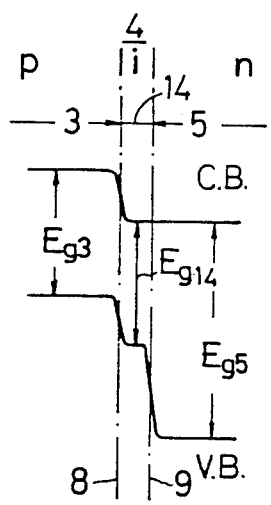 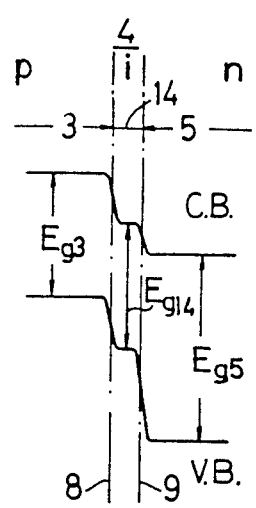
Fig. 2M  Fig. 2N  Fig. 2O
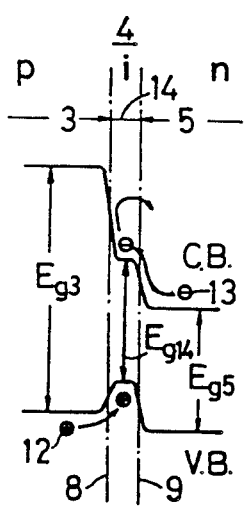 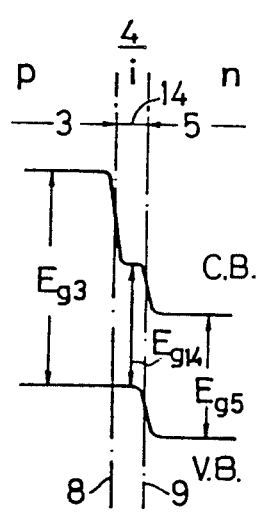 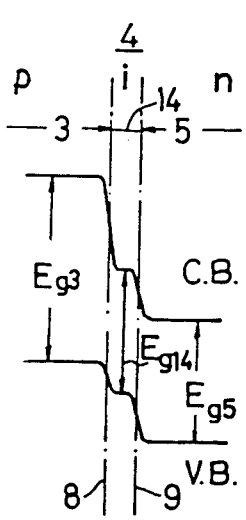

Fig.11
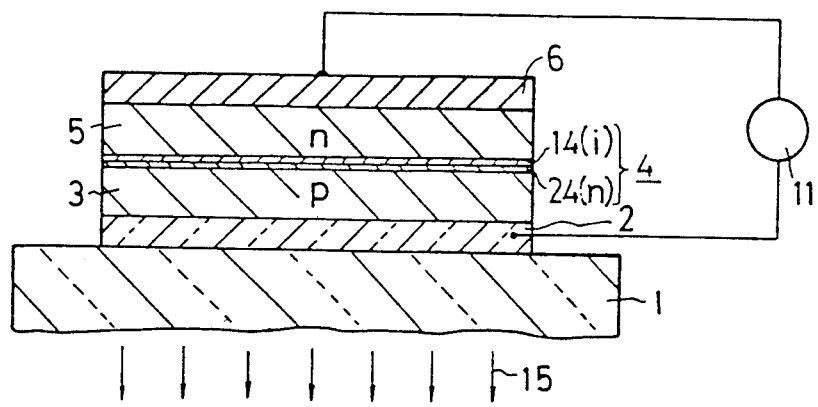
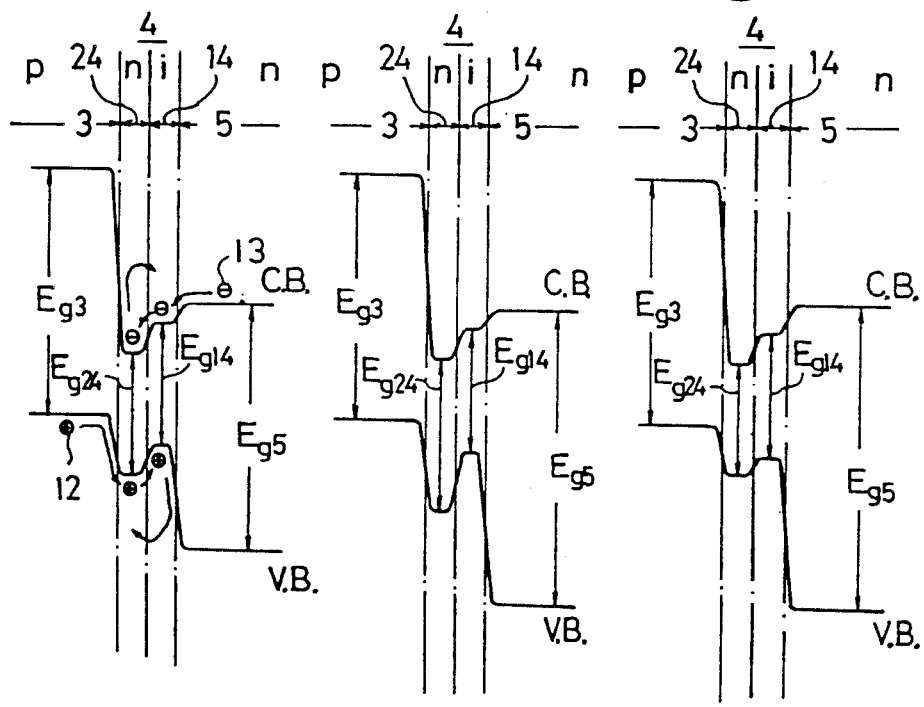
Fig.12A  Fig.12B  Fig.12C

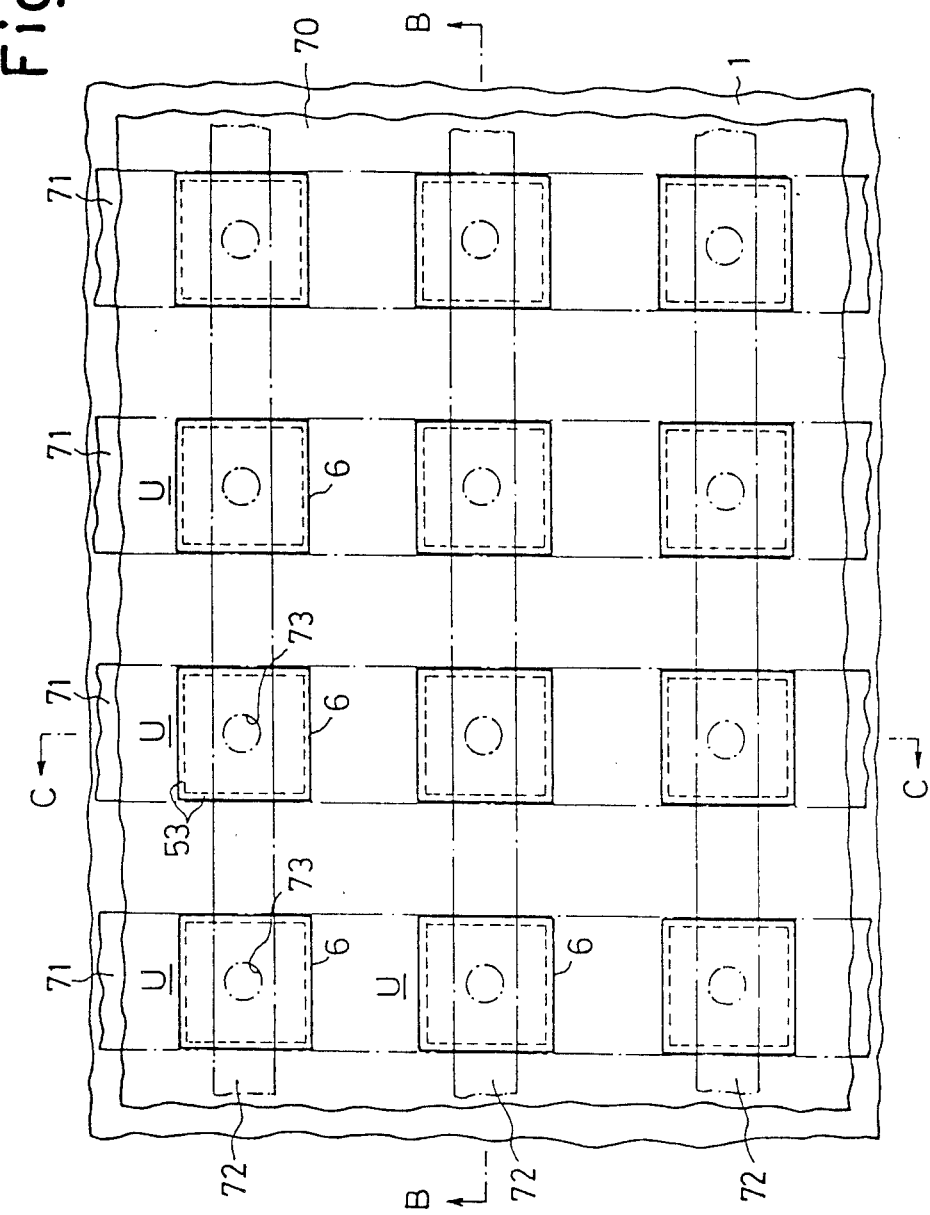

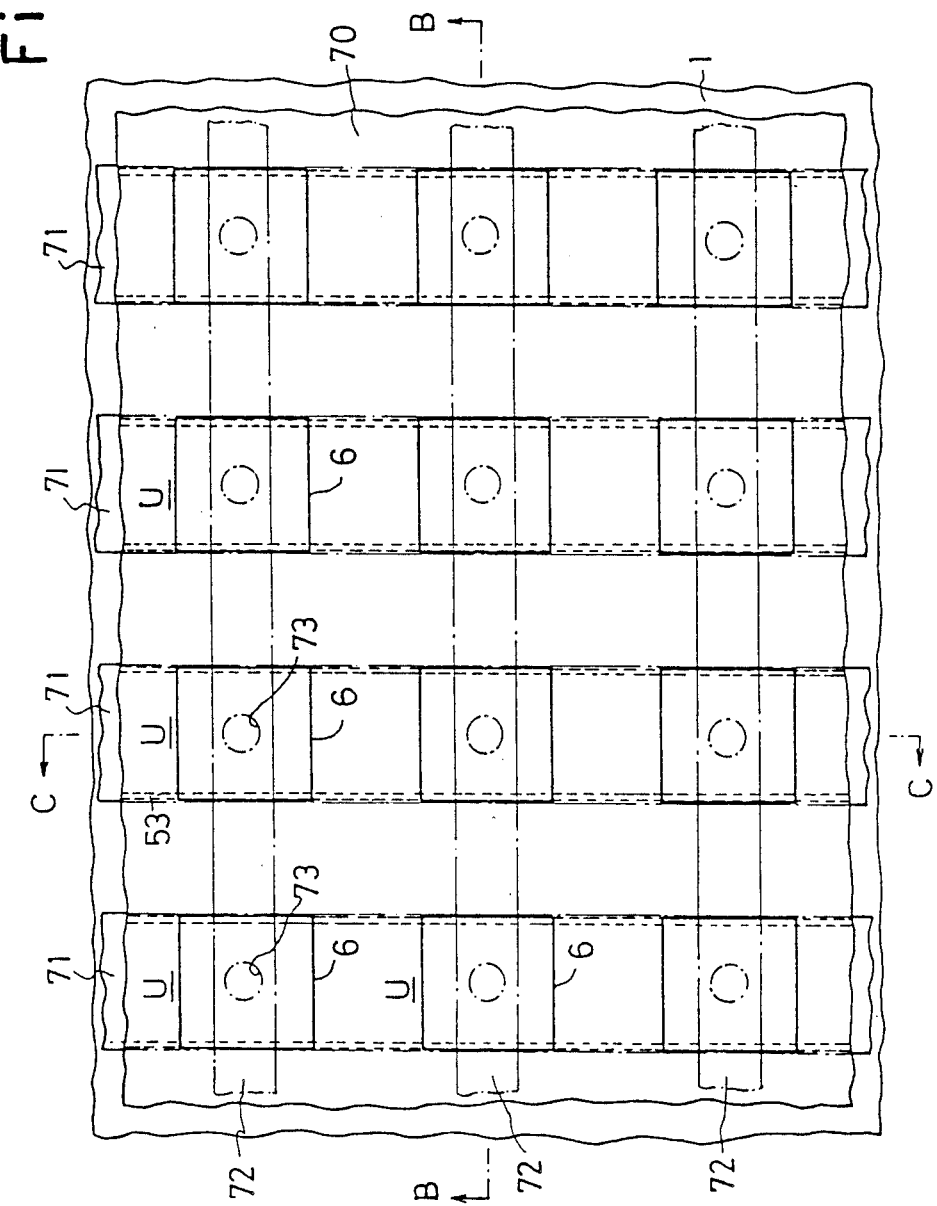

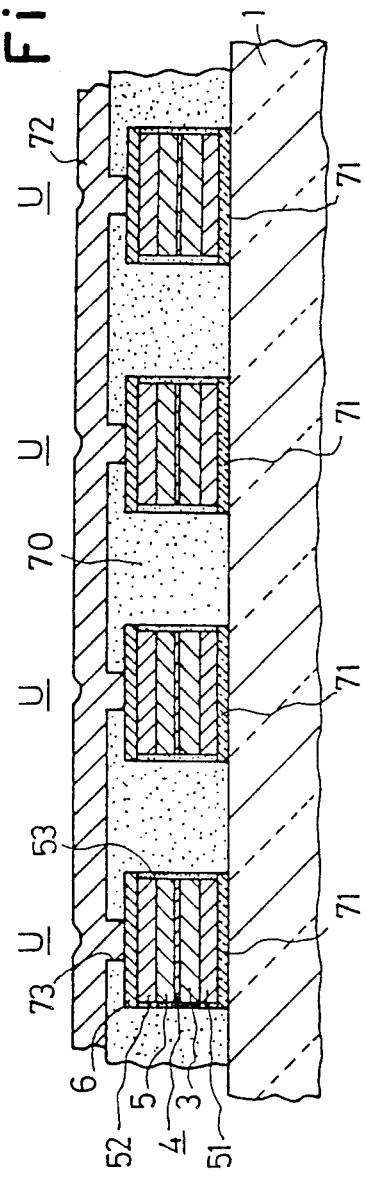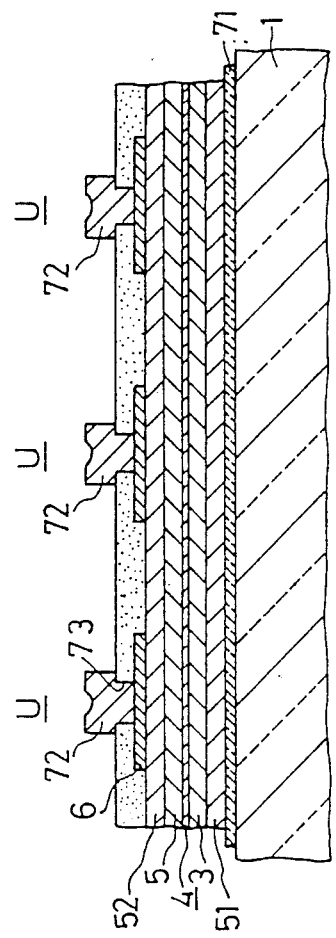

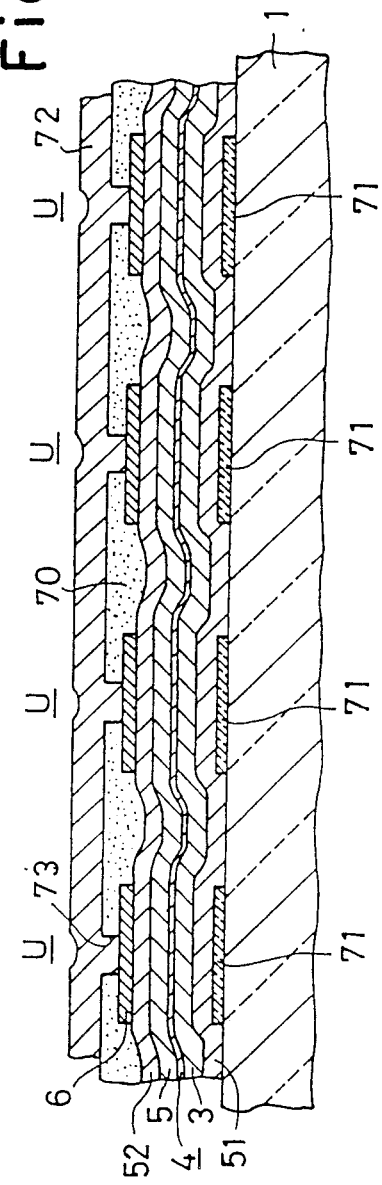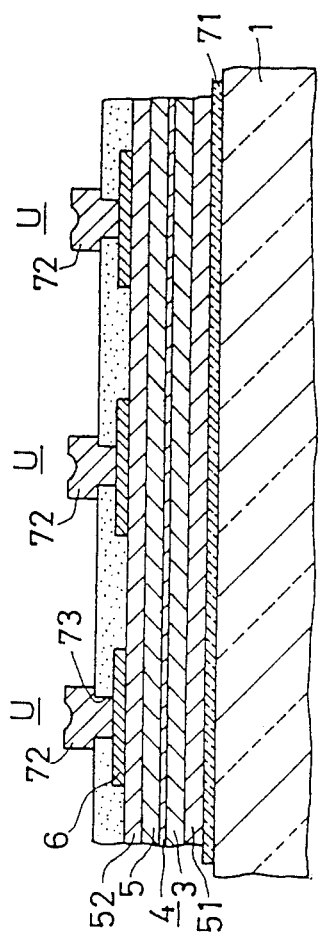

NON-SINGLE-CRYSTALLINE LIGHT EMITTING SEMICONDUCTOR DEVICE MATRIX WITH INSULATION

This application is a continuation of Ser. No. 014,184, filed Feb. 11, 1987, which itself was a divisional of Ser. No. 742,700, filed Feb. 9, 1982, both now abandoned, which itself is a divisional of Ser. No. 347,359, filed Feb. 9, 1982 now U.S. Pat. No. 4,527,179 issued Jul. 2, 1985.

BACKGROUND OF THE INVENTION

1. Field of the Invention

The present invention relates to a light emitting semiconductor device which is constituted using semiconductor layers.

2. Description of the Prior Art

Heretofore there has been proposed a light emitting semiconductor device of the type that p and n type single crystal semiconductor layers are formed one on the other to define therebetween a pn junction. In this case, the single crystal semiconductor layers are usually formed of direct gap semiconductors of the III-V compounds, such as GaAs, $GaAs_{1-x}P(0<x<1)$, $Ga_{1-x}Al_xAs(0<x<1)$ and so forth. The reason for using such direct gap III-V compound semiconductors is that they provide for enhanced light emission efficiency as compared with indirect gap III-V compound semiconductors. However, the formation of such semiconductor layers involves much difficulty as the semiconductor constituting the layers must be provided in a single crystal form.

Accordingly, the conventional light emitting semiconductor device using semiconductor layers of the direct gap III-V compound semiconductors are difficult and expensive to manufacture.

Furthermore, in the prior art light emitting semiconductor device it is customary that the two single-crystal semiconductor layers laminated to define therebetween the pn junction are formed of direct gap single-crystal III-V compound semiconductors of the same composition, i.e. of the same energy gap, and hence the pn junction is a homojunction.

With such a light emitting semiconductor device, when applying a forward bias voltage to the pn junction so as to emit light, the barrier height of the pn junction is decreased, facilitating electrons from the n type semiconductor layer to diffuse deeply into the p type semiconductor layer across the pn junction and holes from the p type semiconductor layer to diffuse deeply into the n type semiconductor layer across the pn junction.

This leads to the shortcoming of impaired light emission efficiency.

SUMMARY OF THE INVENTION

It is therefore an object of the present invention to provide a novel light emitting semiconductor device which is free from the abovesaid defects of the prior art.

According to an aspect of the present invention, the light emitting semiconductor device comprises using non-single-crystal semiconductor layers. The non-single-crystal semiconductor layers can easily be obtained because the semiconductor forming them is non-single-crystal, not single crystal.

Therefore, the present invention permits easy fabrication of the light emitting semiconductor device at low cost.

According to another aspect of the present invention, the light emitting semiconductor device is provided with a first non-single-crystal semiconductor layer, a second non-single-crystal semiconductor layer formed thereon and a third non-single-crystal semiconductor layer formed thereon, or a first non-single-crystal semiconductor layer, many second non-single-crystal semiconductor layers formed thereon and a third non-single-crystal semiconductor layer formed on the first semiconductor layer in such a manner that the second semiconductor layers are buried in the third layer. The first and third semiconductor layers respectively have either one of p and n conductivity types and the other so as to form, a pin or pn junction, including the second semiconductor layers.

In this case, non-single-crystal semiconductors forming the first, second and third semiconductor layers are doped with a dangling bond and recombination center neutralizer. Hence the non-single-crystal semiconductors behave as direct gap semiconductors.

The non-single-crystal semiconductor forming the second semiconductor layer is smaller in energy gap than the non-single-crystal semiconductors of the first and third semiconductor layers. For this reason, when applying a bias forward voltage relative to the pin or pn junction so as to effect light emission, even if the barrier height of the pin or pn junction is reduced, at least electrons from the third (or first) non-single-crystal semiconductor layer do not easily diffuse into the first (or third) layer across the junction, or holes from the first (or third) non-single-crystal semiconductor layer do not easily diffuse into the third (or first) layer across the junction. As a consequence, radiative recombination of the electrons and holes is effectively developed in the second non-single-crystal semiconductor layer.

Therefore, the present invention is able to offer a light emitting semiconductor device of high light emission efficiency.

Other objects, features and advantages of the present invention will become more fully apparent from the following detailed description taken in conjunction with the accompanying drawings.

BRIEF DESCRIPTION OF THE DRAWINGS

FIGS. 9 and 11 are enlarged sectional views schematically illustrating fifth and sixth embodiments of the present invention, respectively.

FIGS. 10A to 10C and 12A to 12C schematically show energy band structures explanatory of the fifth and sixth embodiments, respectively.

FIG. 39A is a plan view schematically illustrating a twenty-seventh embodiment of the present invention;

FIG. 42A is a plan view schematically illustrating a twenty-ninth embodiment of the present invention;

FIGS. 42B and 42C are sectional views taken on the lines B—B and C—C in FIG. 42A, respectively.

FIGS. 43B and 43C are sectional views taken on the lines B—B and C—C in FIG. 43A, respectively.

DESCRIPTION OF THE PREFERRED EMBODIMENTS

Figure 1:
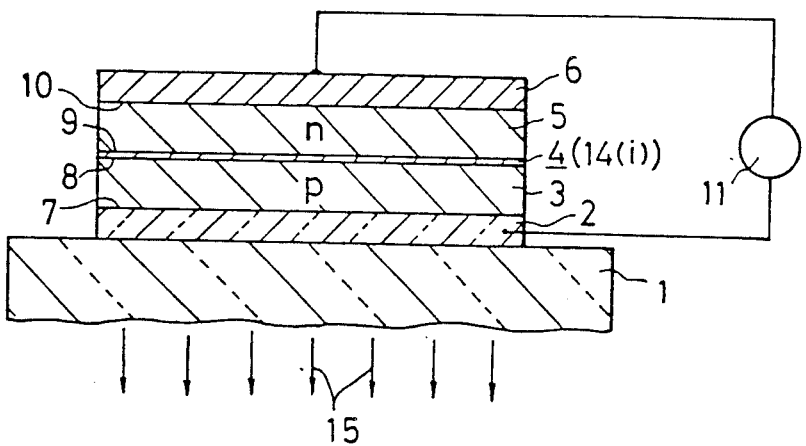
FIG. 1 is an enlarged sectional view schematically illustrating a first embodiment of the light emitting semiconductor device of the present invention.

FIG. 1 schematically illustrates a first embodiment of the light emitting semiconductor device of the present invention, in which a light-transparent electrode 2 is formed on a light-transparent insulated substrate 1. The insulated substrate 1 may be formed as of glass, ceramic, synthetic resin of the like material. The electrode 2 may be formed as tin oxides, indium oxide, antimony oxide, indium-titanium oxide, a mixture of antimony oxide and titanium oxide or the like.

On the light-transparent electrode 2, semiconductor layer 3, 4 and 5 are formed one on another in this order:

The semiconductor layers 3, 4 and 5 are each formed of a non-single-crystal semiconductor such as an amorphous, semi-amorphous or polycrystalline semiconductor. The semi-amorphous semiconductor has such a structure that its degree of crystallization varies spatially, and it is typically a semiconductor which is composed of a mixture of a micro-crystalline semiconductor having a lattice strain and a particle size of 5 to 200 Å and a non-single-crystal semiconductor such as an amorphous semiconductor. The non-single-crystal semiconductor, which forms each of the semiconductor layers 3, 4 and 5, may be the Group IV element such as silicon (Si) or germanium (Ge), a carbide of the Group IV element such as silicon carbide $(Si_xC_{1-x})\emptyset < x < x)$ or germanium carbide $(Ge_xC_{1-x})\emptyset < x < 1)$, a nitride of the Group IV element such as silicon nitride $(Si_3N_{4-x})\emptyset < x < 4)$ or germanium nitride $(Ge_3N_{4-x})\emptyset < x < 4)$, or an oxide of the Group IV element such as silicon oxide $(SiO_{2-})\emptyset < x < 2)$.

The non-single-crystal semiconductor forming the layer 3 is doped with the Group III element which is a p type impurity, such as boron (B), aluminum (Al), or indium (In), to make the layer 3 p-type. The non-single-crystal semiconductor forming the layer 5 is doped with the Group V element which is an n type impurity, such as phosphors (P), arsenic (As), or antimony (Sb), rendering the layer 5 n-type.

The semiconductor layer 4 is composed of a non-single-crystal semiconductor 14. The non-single-crystal semiconductor forming the layer 14 is not doped with any of the abovesaid Group III and IV elements or it is doped with them so that the conductivity type of the layer 14 may be compensated for, making the layer 14 exhibit the i conductivity type.

The non-single-crystal semiconductors constituting the layers 3, 4 and 5 are each doped with a dangling bond and recombination center neutralizer such as hydrogen or a halogen such as fluorine. In consequence, the non-single-crystal semiconductor behaves as a direct gap one to generate radiative recombination of carriers.

Figures 2A, 2B, 2C:
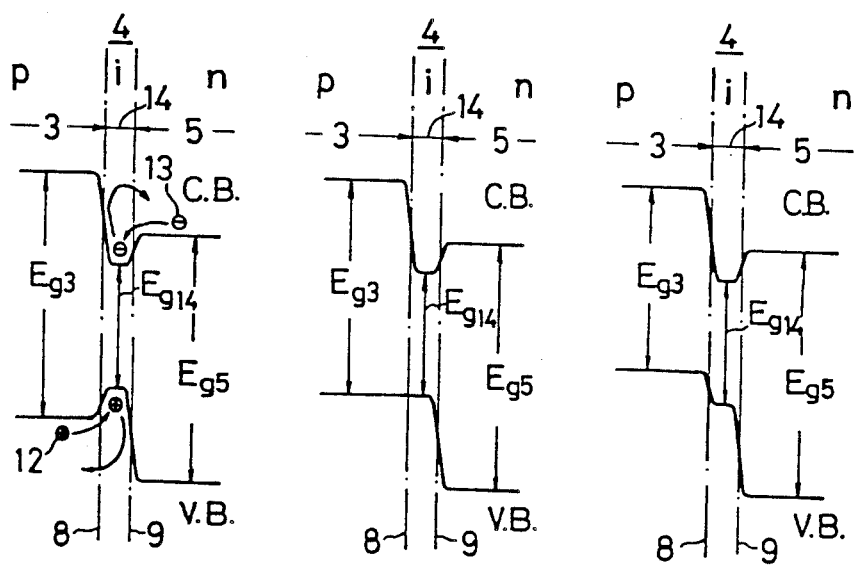
FIG. 2A to 2O schematically show energy band structures explanatory of the first embodiment.
Figure 2D:
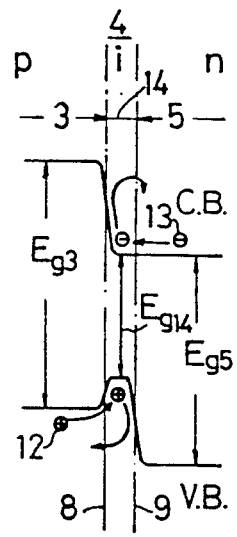
Figure 2E:
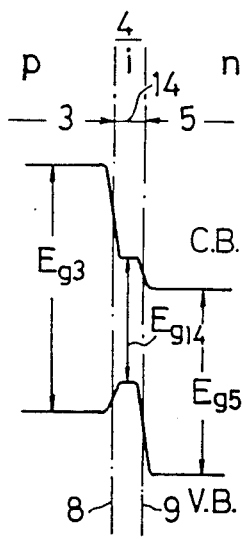
Figure 2F:
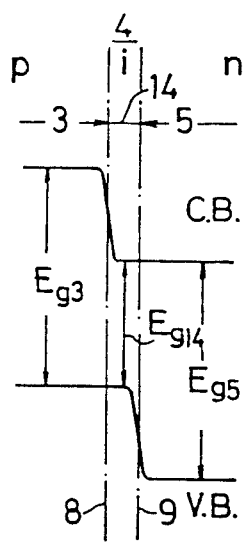
Figure 2G:
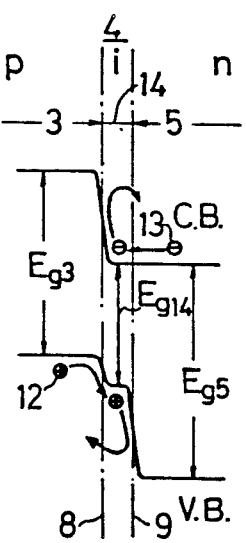
Figure 2H:
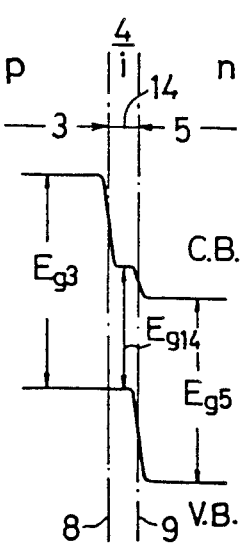
Figure 2I:
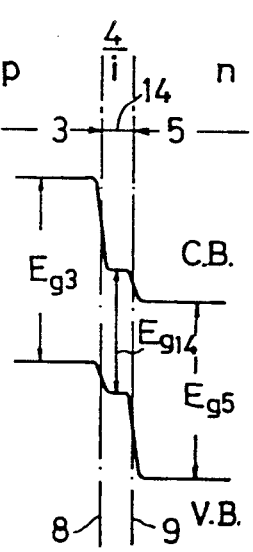

The non-single-crystal semiconductors for the layers 3, 4 and 5 may be the aforementioned Group IV element, its carbide, nitride or oxide or its compound semiconductor but the non-single-crystal semiconductor of the layer 4 and consequently the layer 14 has a smaller energy gap than does the non-single-crystal semiconductors of the layers 3 and 5. That is to say, letting the energy gaps of the non-single-crystal semiconductors of the layers 3, 14 and 5 be represented by $Eg_3$, $Eg_4$ and $Eg_5$, respectively, they bear relationships $Eg_3 > Eg_{14}$, $Eg_5 > Eg_{14}$ as shown in FIGS. 2A to 2I, $Eg_3 \geq Eg_{14}$, $Eg_5 > Eg_{14}$ as shown in FIGS. 2J to 2L, (which illustrate the case of $Eg_3 \div Eg_{14}$), $Eg_5 \geq Eg_{14}$, $Eg_5 > Eg_{14}$ as shown in FIGS. 2M to 2O (which illustrate the case of $Eg_5 \div Eg_{14}$). In the case where the energy gaps $Eg_3$, $Eg_{14}$ and $Eg_5$ bear relationships $Eg_3 > Eg_{14}$, $Eg_5 > Eg_{14}$, the energy gaps $Eg_3$ and $Eg_5$ may bear a relationship $Eg_3 = Eg_5$ as shown in FIGS. 2A, 2F and 2I, $Eg_3 > Eg_5$ as shown in FIGS. 2B, 2C, and 2G, or $Eg_3 > Eg_5$ as shown in FIGS. 2D, 2E and 2H. In order that the energy gaps $Eg_3$, $Eg_{14}$ and $Eg_5$ of the semiconductors of the layers 3, 14 and 5 may bear the abovesaid relationships, these layers 3, 14 and 5 may preferably be formed of a silicon carbide ($Si_xC_{1-x}$)($0 \leq x \leq 1$). In this case, however, the value of x in the $Si_xC_{1-x}$ used for the layer 14 is selected larger than the value of x in the $Si_xC_{1-x}$ for the layers 3 and 5. In such a case, the energy gap $Eg_{14}$ of the semiconductor of the layer 14 is obtained in the range of 1.5 to 1.7 eV and the energy gaps $Eg_3$ and $Eg_5$ of the semiconductors of the layers 3 and are obtained in the range of 2.0 to 4.0 eV.

It is preferred that the semiconductor of the layer 14 be $Si_xGe_{1-x}$($0 \leq x \leq 1$) and the semiconductors of the layers 3 and 5 $Si_xC_{1-x}$($0 \leq x \leq 1$). In this case, however, the value of x in the $Si_xGe_{1-x}$ is selected larger than the value of x in the $Si_xC_{1-x}$.

Further, it is preferable that the semiconductors of the layers 3, 14 and 5 be $Si_xGe_{1-x}$($0 \leq x \leq 1$). In this case, however, the value of x in the $Si_xGe_{1-x}$ for the layer 14 is selected larger than the value of x in the $Si_xGe_{1-x}$ for the layers 3 and 5.

Still further, it is preferable that the semiconductor of the layer 14 be $Si_xC_{1-x}$($0 \leq x \leq 1$) and the semiconductors of the layers 3 and 5 $Si_3N_{4-x}$($0 \leq x \leq 4$).

The non-single-crystal semiconductor layer 3 makes ohmic contact with the light-transparent electrode 2. The non-single-crystal layer 14 defines a pi junction 8 between it and the semiconductor layer 3. When the energy gaps $Eg_3$ and $Eg_{14}$ of the non-single-crystal semiconductors forming the layers 3 and 14 bear the abovesaid relation $Eg_3 > Eg_{14}$ or $Eg_3 < Eg_{14}$, the pi junction 8 is heterojunction but, in the case of $Eg_3 = Eg_{14}$, it is a homojunction. The non-single-crystal semiconductor layer 5 forms an ni junction 9 between it and the semiconductor layer 14. When the energy gaps $Eg_{14}$ and $Eg_5$ of the semiconductors forming the layers 14 and 5 have the aforesaid relation $Eg_{14} < Eg_5$ or $Eg_{14} > Eg_5$, the ni junction 9 is a heterojunction and, in the case of $Eg_{14} = Eg_5$, it is a homojunction.

The semiconductor layers 3, 4 and 5 can be obtained very easily by the plasma CVD technique because the semiconductor forming them may be non-single-crystal. The semiconductor layers 3 and 5 are usually formed to a desired thickness exceeding 0.1 $\mu$m. The semiconductor layer 14 is usually thinner than the semiconductor layers 3 and 5; it is 100 Å to 2 $\mu$m thick, in particular, 0.1 to 0.4 $\mu$m.

The semiconductor layers 3, 4 and 5 form the pi junction 8 between the layers 3 and 14 and the ni junction 9 between the layers 14 and 5, constituting a pin junction structure as a whole.

The semiconductor layers 3 and 5 have such impurity concentrations which provide such energy band profiles as shown in FIGS. 2A to 2O when a forward bias voltage is applied to the abovesaid pin junction structure in the case where the energy gaps $Eg_3$, $Eg_{14}$ and $Eg_5$ of the semiconductors forming the semiconductor layers 3, 14 and 5 bear the aforementioned relationships. That is to say, the semiconductor layers 3 and 5 have such impurity concentrations that at least an edge of the conduction band C.B. of the semiconductor forming the layer 3 assumes a higher energy potential position than does the edge of the conduction band C.B. of the semiconductor forming the layer 14, or an edge of the valence band V.B. of the semiconductor forming the layer 5 assumes a higher energy potential position than does the edge of the valence band V.B. of the semiconductor forming the layer 14. In the drawings, there is shown the case where the edges of the conduction band C.B. of the semiconductor of the layer 3 and the valence band V.B. of the semiconductor of the layer 5 are respectively higher than the edges of the conduction band C.B. and the valence band V.B. of the semiconductor of the layer 14.

The non-single-crystal semiconductor layer 5 is covered with an opaque electrode 6 to make ohmic contact therewith as indicated by 10. The opaque electrode 6 may be formed of aluminum (Al), nickel (Ni), cobalt (Co), molybdenum (Mo) or the like.

When connecting a bias power source 11 across the electrodes 2 and 6 making the former positive relative to the latter, the pin junction constituted by the semiconductor layers 3, 14 and 5 is biased in a forward direction. As a result of this, holes 12 from the p type semiconductor layer tend to flow out therefrom into the n type semiconductor layer 5 across the pi junction 8, the i type semiconductor layer 14 and the ni junction 9 as typically depicted in FIGS. 2A, 2D, 2G, 2I and 2M. Conversely, electrons 13 from the n type semiconductor layer 5 also tend to flow into the p type semiconductor layer 3 across the ni junction 9, the i type semiconductor layer 14 and the pi junction 8. However, in the case where the edge of the valence band V.B. of the semiconductor of the layer 5 assumes a higher potential position than does the edge of the valence band of the semiconductor forming the layer 14, the ni junction 9 constitutes a high barrier against the holes 12. This limits the flowing of the holes 12 into the semiconductor layer 5 across the ni junction 9, resulting in increased density of holes in the layer 14. Where the edge of the conduction band C.B. of the semiconductor of the layer 3 assumes a higher position than the conduction band C.B. of the semiconductor of the layer 14, the pi junction makes up a high barrier against the electrons 13. This limits the flowing of the electrons 13 into the semiconductor layer 3 across the pi junction 8, increasing the density of the electrons 13 in the layer 14.

As a result of this, direct transition type radiative recombination of carriers is effectively developed in the semiconductor layer 14, generating light with high efficiency. The light generated in the semiconductor layer 14 is emitted to the outside, passing through the semiconductor layer 3, the transparent electrode 2 and the transparent insulated substrate 1 as indicated by 15 in FIG. 1. In this case, a portion of the light is directed towards the electrode 6 through the semiconductor layer 5 but it is reflected by the electrode 6 to be emitted to the outside through the semiconductor layers 5, 4 and 3, the transparent electrode 2 and the transparent substrate 1 as similarly indicated by 15. The light 15 thus emitted has a wavelength corresponding to the energy gap $Eg_{14}$ of the semiconductor of the layer 14.

Figure 3:
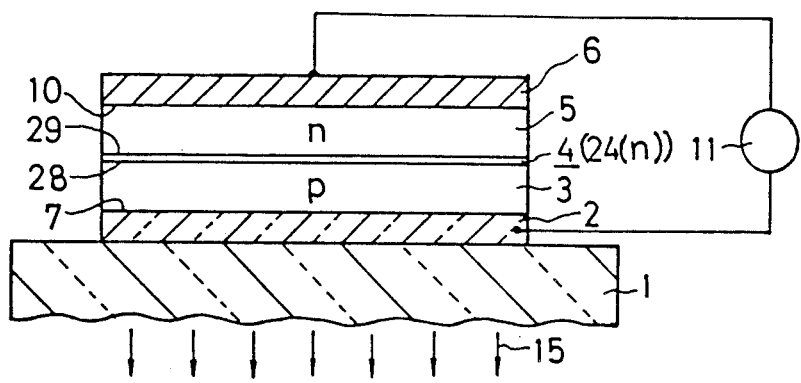
FIG. 3 is an enlarged sectional view schematically illustrating a second embodiment of the present invention.
Figure 4A:
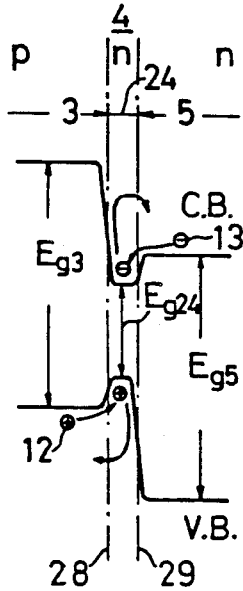
FIGS. 4A to 4O schematically show energy band structures explanatory of the second embodiment.
Figure 4B:
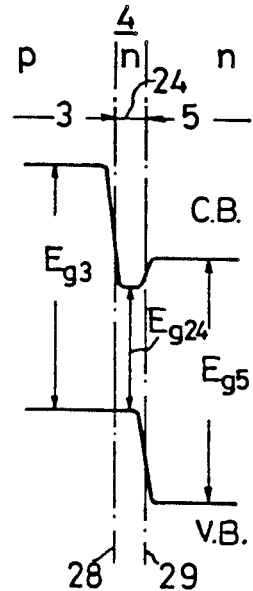
Figure 4C:
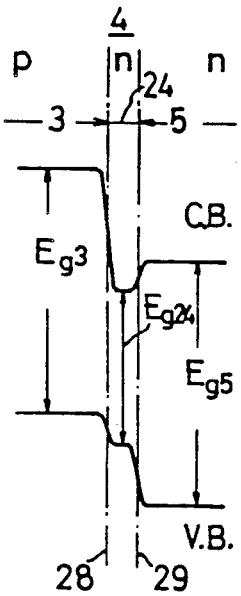
Figure 4D:
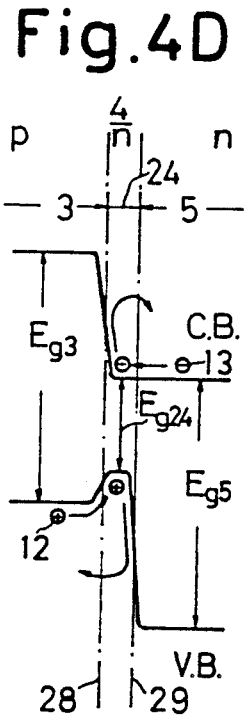
Figure 4E:
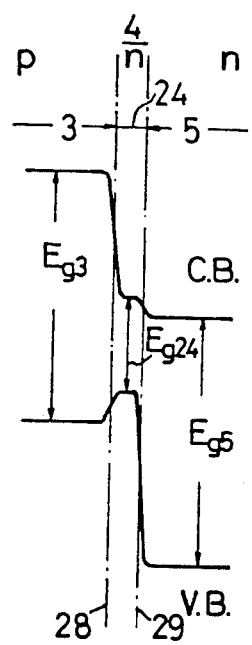
Figure 4F:
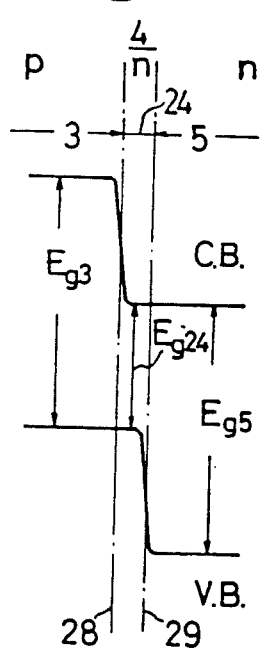
Figure 4G:
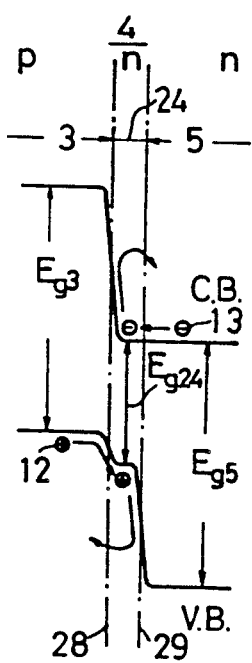
Figure 4H:
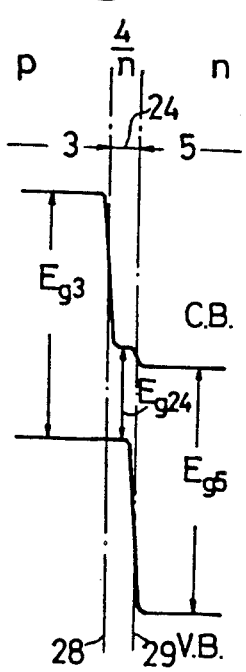
Figure 4I:
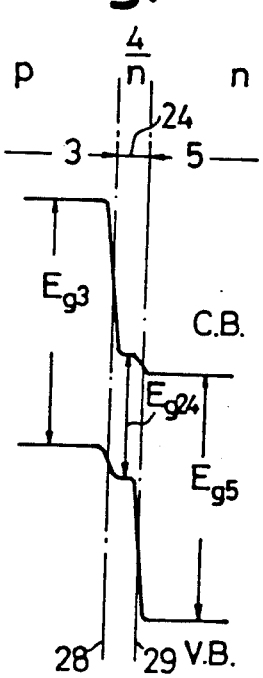
Figure 4J:
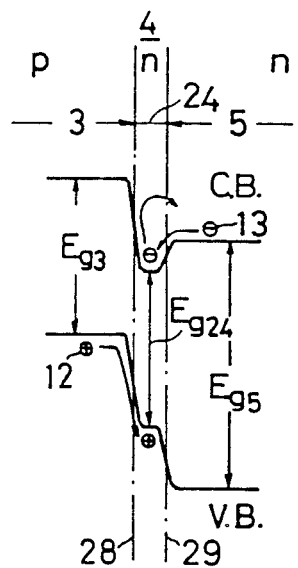
Figure 4K:
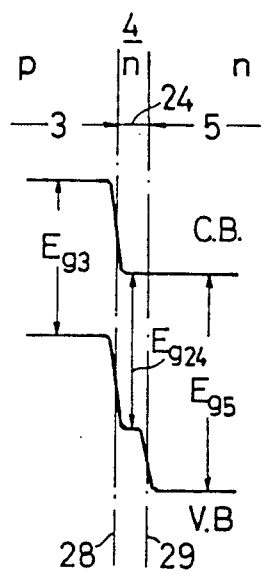
Figure 4L:
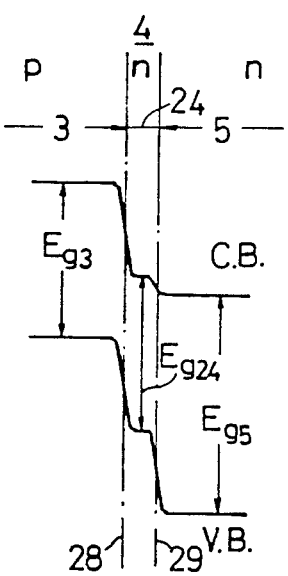
Figure 4M:
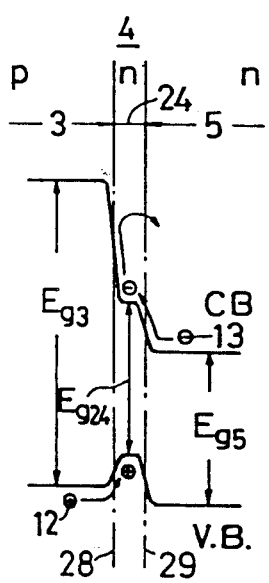
Figure 4N:
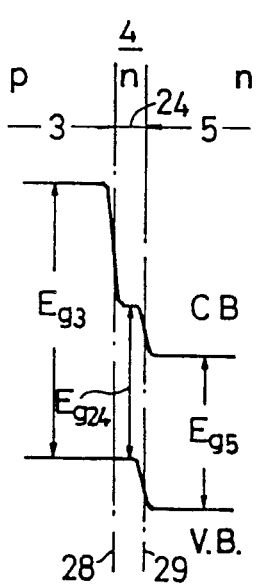
Figure 4O:
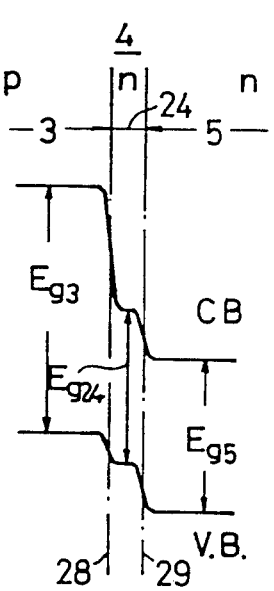

FIG. 3 illustrates a second embodiment of the light emitting semiconductor device of the present invention. The parts corresponding to those in FIG. 1 are identified by the same reference numerals.

The light emitting semiconductor device of this embodiment is identical in construction with the embodiment of FIG. 1 except that the i type semiconductor layer 14 forming the non-single crystal semiconductor layer 4 of the latter is replaced with an n type non-single-crystal semiconductor layer 24 to form a pn junction between the semiconductor layers 3 and 24 and an nn junction 29 between the semiconductor layers 24 and 5.

The semiconductor layer 24 is formed of the same non-single-crystal semiconductor as is employed for the semiconductor layer 14 in the embodiment of FIG. 1 and the non-single-crystal semiconductor is doped with the dangling bond and recombination center neutralizer as in the case of FIG. 1. Accordingly, this semiconductor behaves as one that develops direct transition type radiative recombination of carriers.

The non-single-crystal semiconductor, which forms the semiconductor layer 24, is doped with the same n type impurity as that for the semiconductor layer 5 of the light emitting semiconductor device shown in FIG. 1, whereby the semiconductor layer 24 is made n-type.

The semiconductor of the semiconductor layer 24 has an energy gap $Eg_{24}$ smaller than the energy gap $Eg_3$ of the semiconductor layer 3 and/or the energy gap $Eg_5$ of the semiconductor of the layer 5 as is the case with the energy gap $Eg_{14}$ of the semiconductor of the layer 14 in the embodiment of FIG. 1. Accordingly, when the energy gaps $Eg_3$ and $Eg_{24}$ of the semiconductors of the layers 3 and 24 bear such a relationship as $Eg_3 > Eg_{24}$ or $Eg_3 < Eg_{24}$, the pn junction 28 is a heterojunction but, in the case of $Eg_3 = Eg_{24}$, it is usually a homojunction. The nn junction 29 is a heterojunction when the energy gaps $Eg_{24}$ and $Eg_5$ of the semiconductors of the layers 24 and 5 bear such a relationship as $Eg_{24} < Eg_5$ or $Eg_{24} > Eg_5$ and, in the case of $Eg_{24} = Eg_5$, the nn junction 29 is usually homojunction.

The semiconductor layers 3, 24 and 5 have such impurity concentrations that when applying a forward bias voltage to the pn junction 28 in the case where the energy gaps $Eg_3$, $Eg_{24}$ and $Eg_5$ of the semiconductors bear the abovesaid relationship, the edge of the conduction band C.B. of the semiconductor of at least the layer 3 assumes a higher position than the edge of the conduction band of the semiconductor of the layer 24, or the edge of the valence band V.B. of the semiconductor of the layer 5 assumes a higher position than the edge of the valence band of the semiconductor of the layer 24. In practice, the semiconductor layer 24 has a lower impurity concentration than the semiconductor layers 3 and 5.

Connecting across the electrodes 2 and 6 the bias power source 11 which is forward with respect to the pn junction 28, the holes 12 in the p type semiconductor layer 3 tend to flow out therefrom into the n type semiconductor layer 5 across the pn junction 28 and the n type semiconductor layer 29 as typically shown in FIGS. 4A, 4D, 4J and 4M. Further, the electrons 13 in the semiconductor layer 5 also tend to flow out therefrom into the semiconductor layer 3 across the n type semiconductor layer 24. In this case, however, at least the pn junction 28 serves as a high barrier against the holes 12, or the nn junction 29 constitutes a high barrier against the electrons 13. Therefore, the density of the holes 12 and/or electrons 13 increases in the semiconductor layer 24. As a result of this, radiative recombination of carriers effectively takes place in the semiconductor layer 24 to efficiently generate light, which is delivered to the outside as indicated by 15. The light thus emitted has a wavelength corresponding to the energy gap $Eg_{24}$ of the semiconductor of the layer 24.

Figure 5:
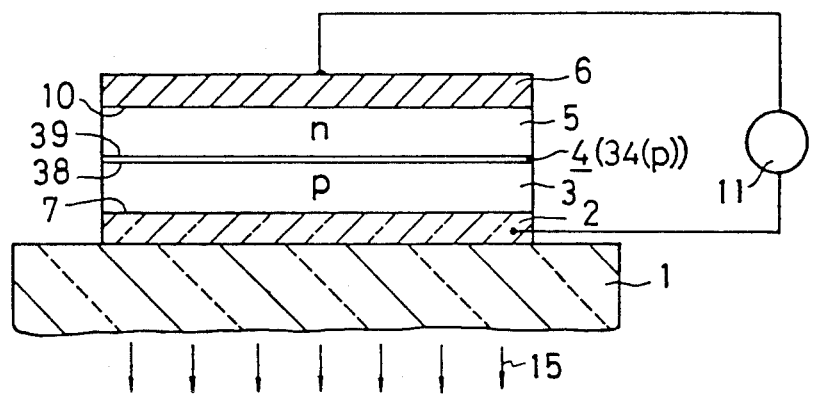
FIG. 5 is an enlarged sectional view schematically illustrating a third embodiment of the present invention.

FIG. 5 illustrates a third embodiment of the light emitting semiconductor device of the present invention, in which the parts corresponding to those in FIG. 1 are identified by the same reference numerals.

This embodiment is identical in construction with the embodiment of FIG. 1 except that the i type non-single-crystal semiconductor layer 14 of the latter is replaced with a p type non-single-crystal semiconductor layer 34, and that a pp junction 38 and a pn junction 39 are formed between the semiconductor layers 3 and 34 and between the semiconductor layers 34 and 5, respectively.

Figures 6A, 6B, 6C:
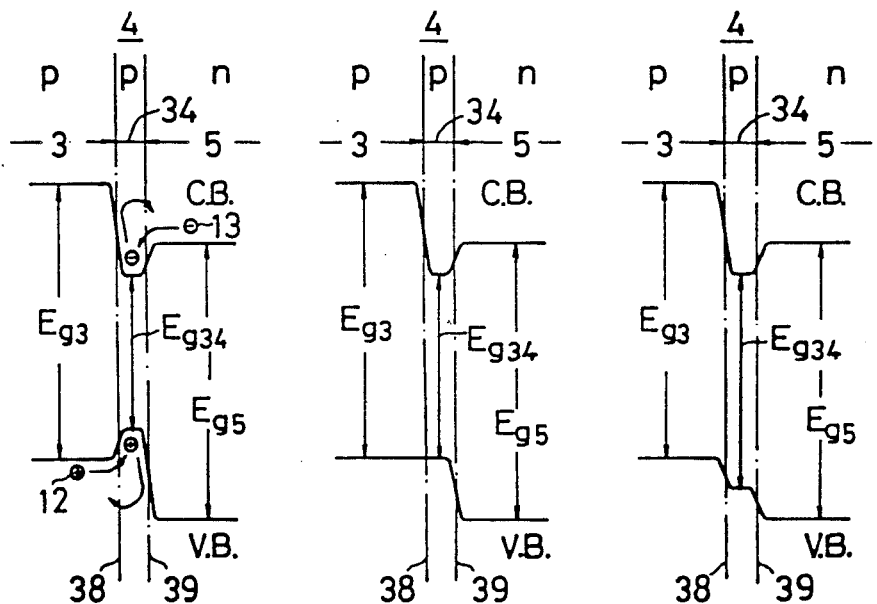
FIGS. 6A to 6O schematically show energy band structures explanatory of the third embodiment.
Figure 6D:
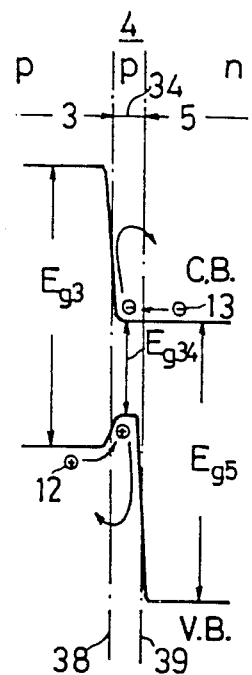
Figure 6E:
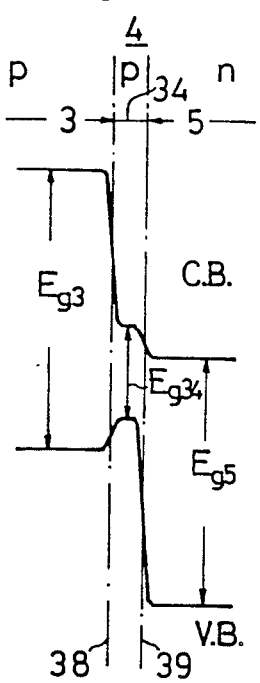
Figure 6F:
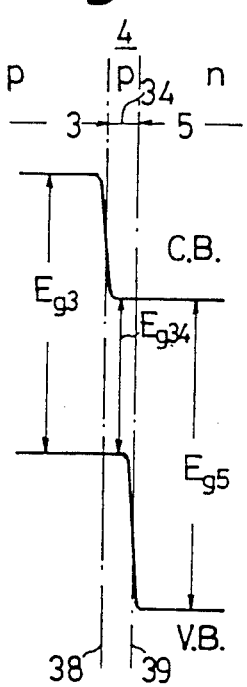
Figure 6G:
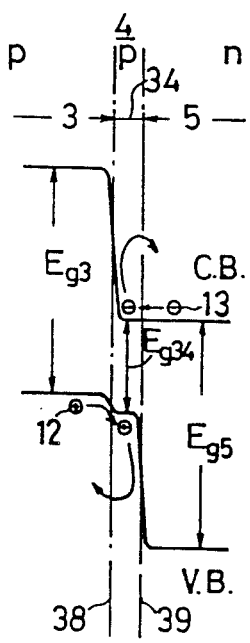
Figure 6H:
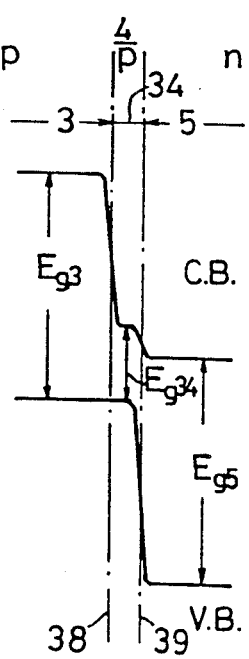
Figure 6I:
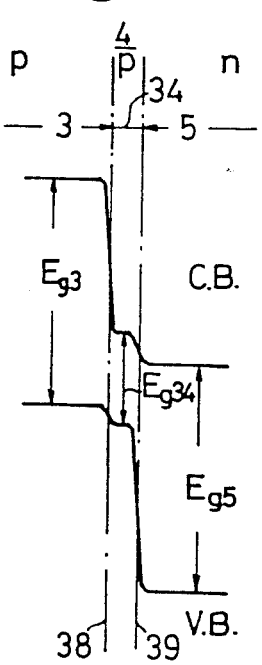
Figure 6J:
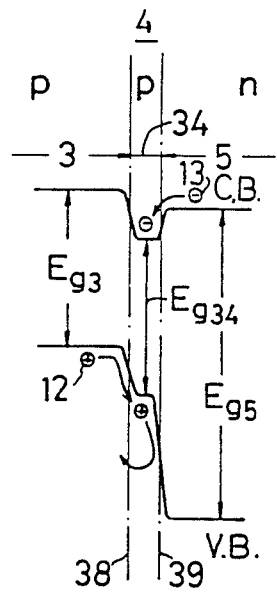
Figure 6K:
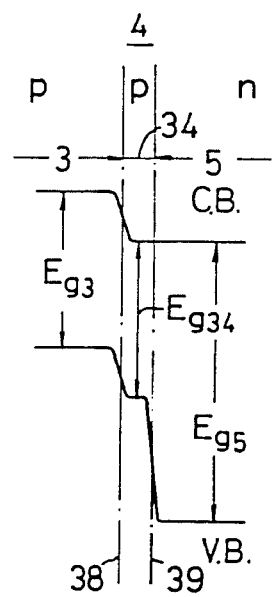
Figure 6L:
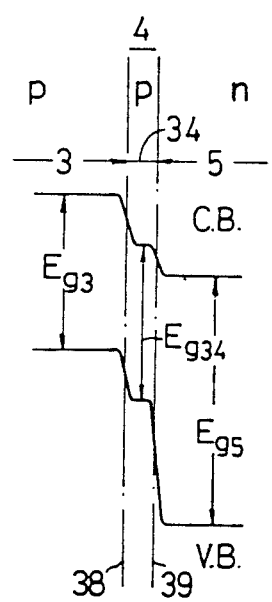
Figure 6M:
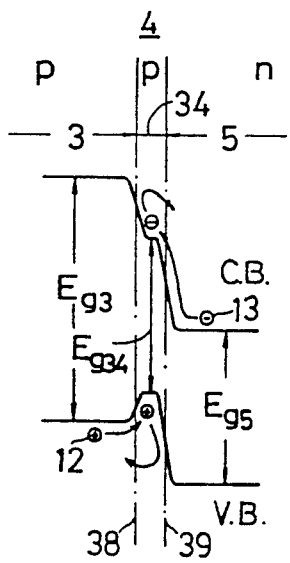
Figure 6N:
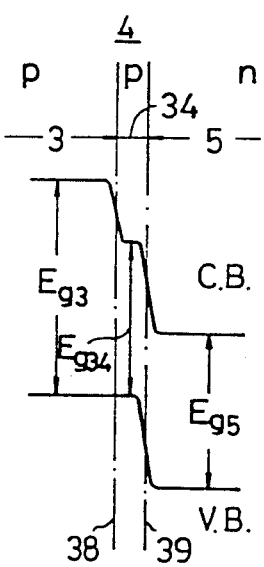
Figure 6O:
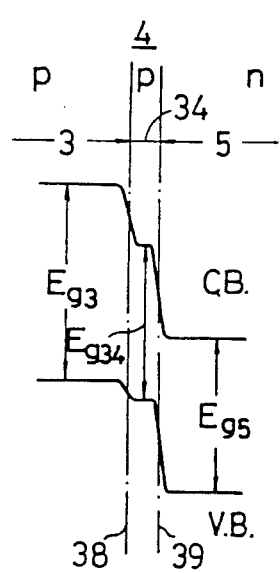

The semiconductor layer 34 has the same structure as the layer 14 in the embodiment of FIG. 1 except that the former is doped with the same p type impurity as that used for the semiconductor in the device of FIG. 1. Accordingly, the semiconductor layers 3, 34 and 5 constitute a pn juncstructure, though no further detailed description will be given of the layer 34. The energy gaps $EG_3$, $Eg_{34}$ and $Eg_5$ of the semiconductors forming the semiconductor layers 3, 34 and 5 assume such relative values and positions as shown in FIGS. 6A to 6θ.

Connecting across the electrodes 2 and 6 the bias power source 11 which is formed with respect to the pn junction 39, light is efficiently emitted as in the case of FIG. 1 as indicated by 15. The light thus emitted has a wavelength corresponding to the energy gap $Eg_{34}$ of the semiconductor layer 34.

Figure 7:
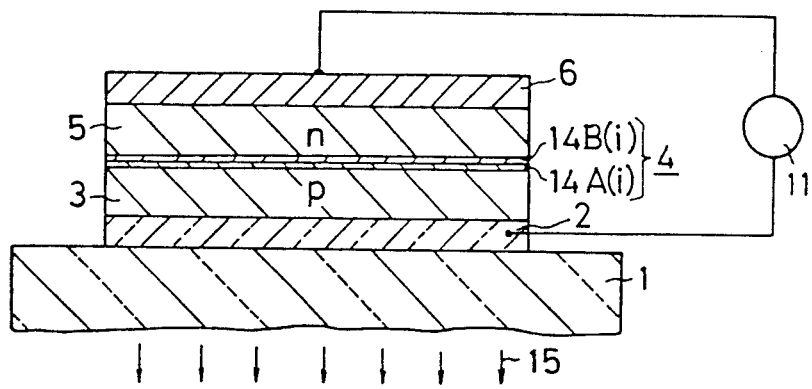
FIG. 7 is an enlarged sectional view schematically illustrating a fourth embodiment of the present invention.
Figure 8A:
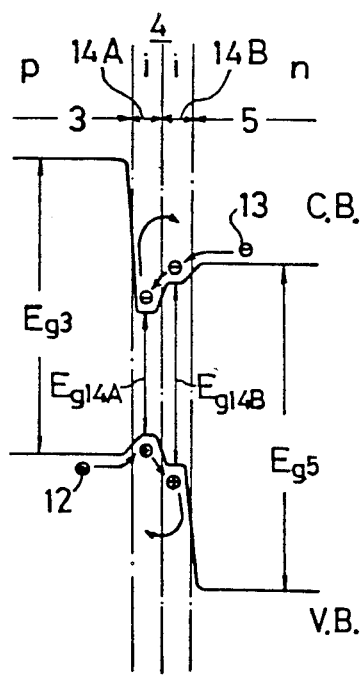
FIGS. 8A and 8B schematically show energy band structures explanatory of the fourth embodiment.
Figure 8B:
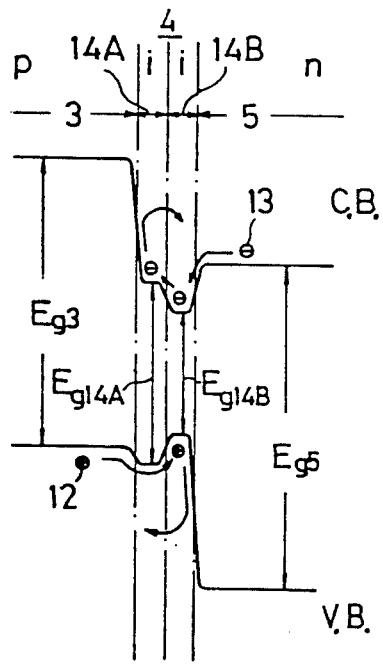

FIG. 7 illustrates a fourth embodiment of the present invention, in which the parts corresponding to those in FIG. 1 are identified by the same reference numerals and no detailed description will be repeated. This embodiment is identical in construction with the embodiment of FIG. 1 except that the non-single-crystal semiconductor layer 4 is made up of two i type non-single-crystal semiconductor layers 14A and 14B formed one on the other. In this case, the semiconductors of the layers 14A and 14B are the same as that of the layer 14 in FIG. 1 and have different energy gaps $Eg_{14A}$ and $Eg_{14B}$ as shown in FIGS. 11A and 11B. As this embodiment is identical in construction with the embodiment of FIG. 1 except the above, the radiative recombination of carriers occurs in the semiconductor layer 4, i.e. the layers 14A and 14B, emitting light though not described in detail. In this case however, the light thus produced is a combination of lights of different wavelengths because the energy gaps $Eg_{14A}$ and $Eg_{14B}$ of the semiconductors of the layers 14A and 14B are different.

Figure 9:
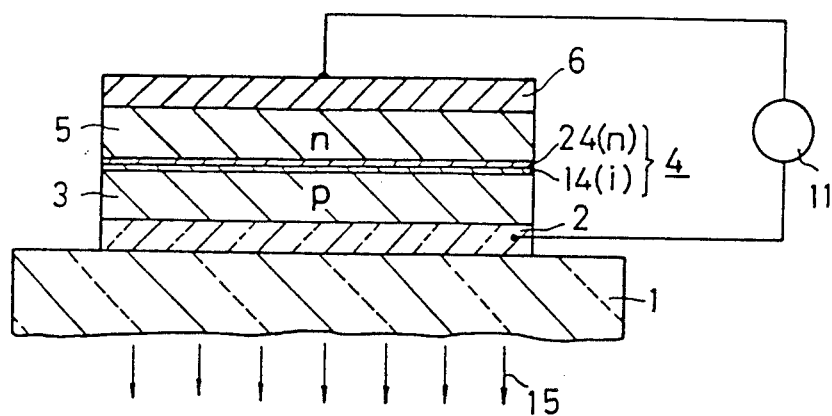
Figures 10A, 10B, 10C:
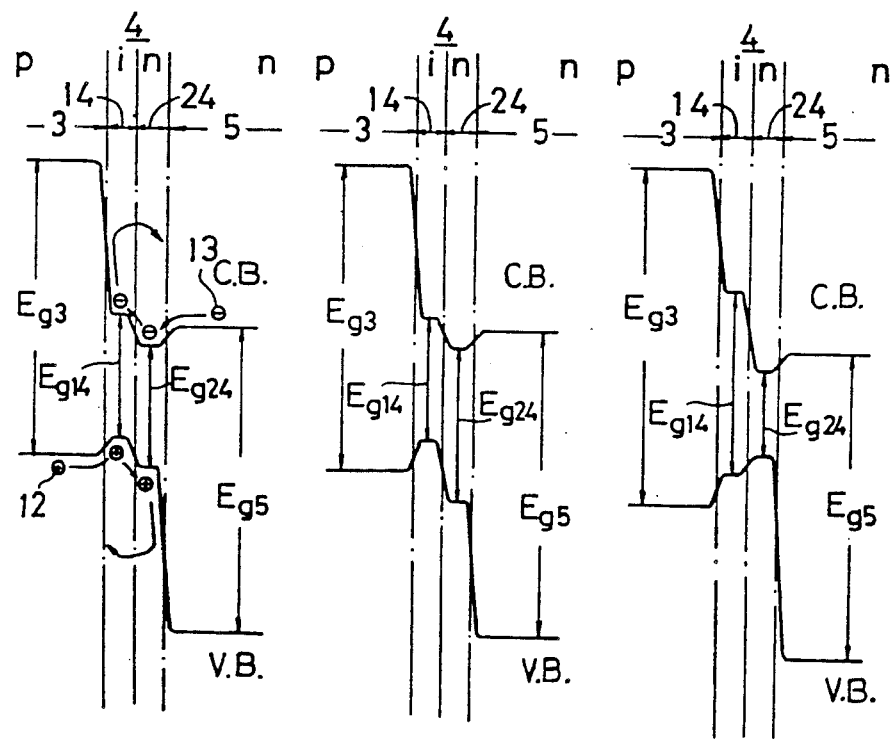

FIGS. 9 and 11 illustrate fifth and sixth embodiments of the present invention, which are identical in construction with the embodiment of FIG. 1 except that the semiconductor layer 4 is formed by the lamination of the i type semiconductor layer 14 described previously in respect of FIG. 1 and the n type semiconductor layer 24 described previously in respect of FIG. 3. In this case, however, the energy gaps $Eg_{14}$ and $Eg_{24}$ of the semiconductors of the layers 14 and 24 may be equal to or different from each other as shown in FIGS. 10A, B and C and FIGS 12A, B and C. In FIG. 9, the layer 14 is shown to be formed on the side of the layer 3 and, in FIG. 11, it is shown to be formed on the side of the layer 5.

With the embodiments of FIGS. 9 and 11, the radiative recombination of carriers occurs in the semiconductor layers 14 and 24 as is the case with FIGS. 1 and 3, emitting light though not described in detail. In this case, if the energy gaps $Eg_{14}$ and $Eg_{24}$ of the semiconductors of the layers 14 and 24 are different from each other, lights of two different wavelengths are combined into a composite light.

Figure 13:
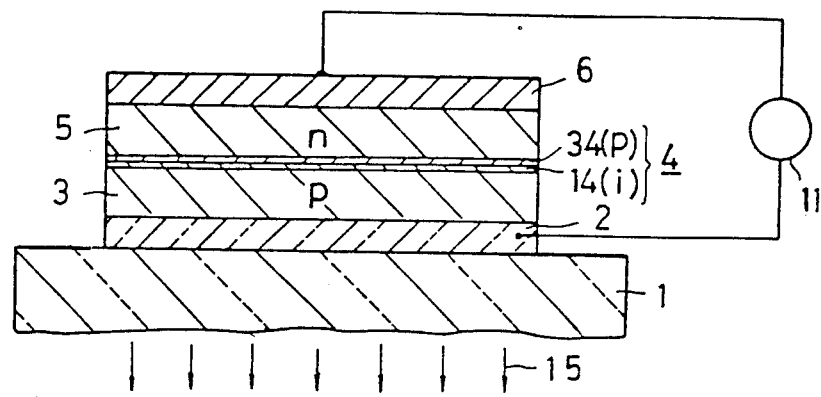
FIGS. 13 and 15 are enlarged sectional view schematically illustrating seventh and eighth embodiments of the present invention, respectively.
Figures 14A, 14B, 14C:
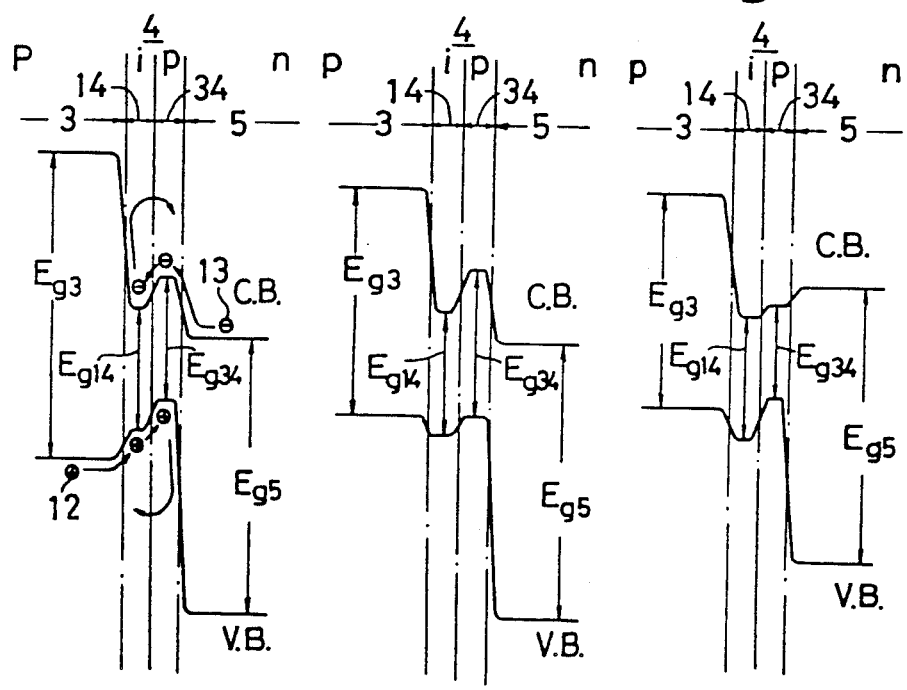
FIGS. 14A to 14C and 16A to 16C schematically show energy band structures explanatory of the seventh and eighth embodiments, respectively.
Figure 15:
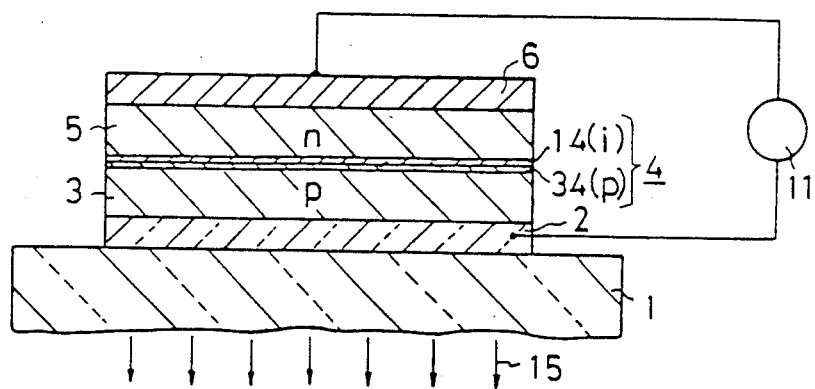
Figures 16A, 16B, 16C:
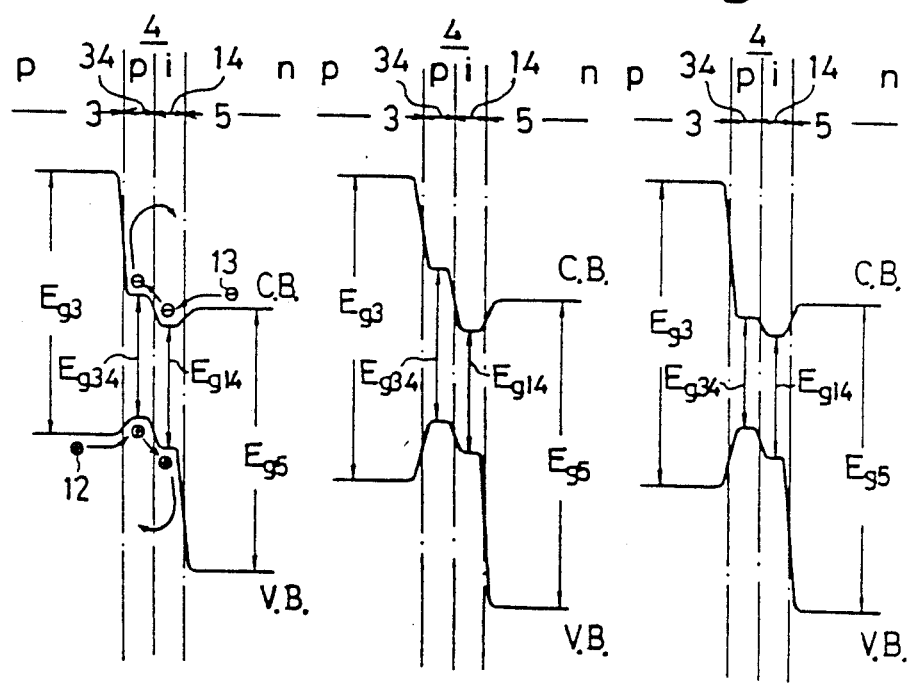

FIGS. 13 and 15 illustrate seventh and eighth embodiments of the present invention, which are identical in construction with the embodiment of FIG. 1 except that the semiconductor layer 4 is formed by the lamination of the i type semiconductor layer 14 described previously in respect of FIG. 1 and the p type semiconductor layer 34 described previously in respect of FIG. 5. In this case, however, the energy gaps $EG_{14}$ and $Eg_{34}$ of the semiconductors of the layers 14 and 34 may be equal to or different from each other as shown in FIGS. 14A, B and C and FIGS. 16A, B and C. In FIG. 13, the layer 14 is shown to be formed on the side of the layer 3 and, in FIG. 15, it is shown to be formed on the side of the layer 5.

With the embodiments of FIGS. 13 and 15, the radiative recombination of carriers occurs in the semiconductor layers 14 and 34 as is the case with FIGS. 1 and 5, emitting light, though not described in detail. In this case, if the energy gaps $Eg_{14}$ and $Eg_{34}$ of the semiconductors of the layers 14 and 34 are different from each other, lights of two different wavelengths are combined into a composite light.

Figure 17:
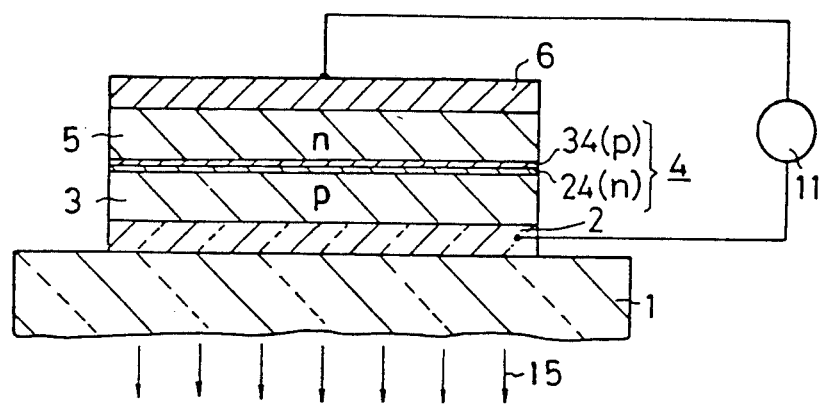
FIGS. 17 and 19 are enlarged sectional views schematically illustrating ninth and tenth embodiments of the present invention, respectively.
Figures 18A, 18B, 18C:
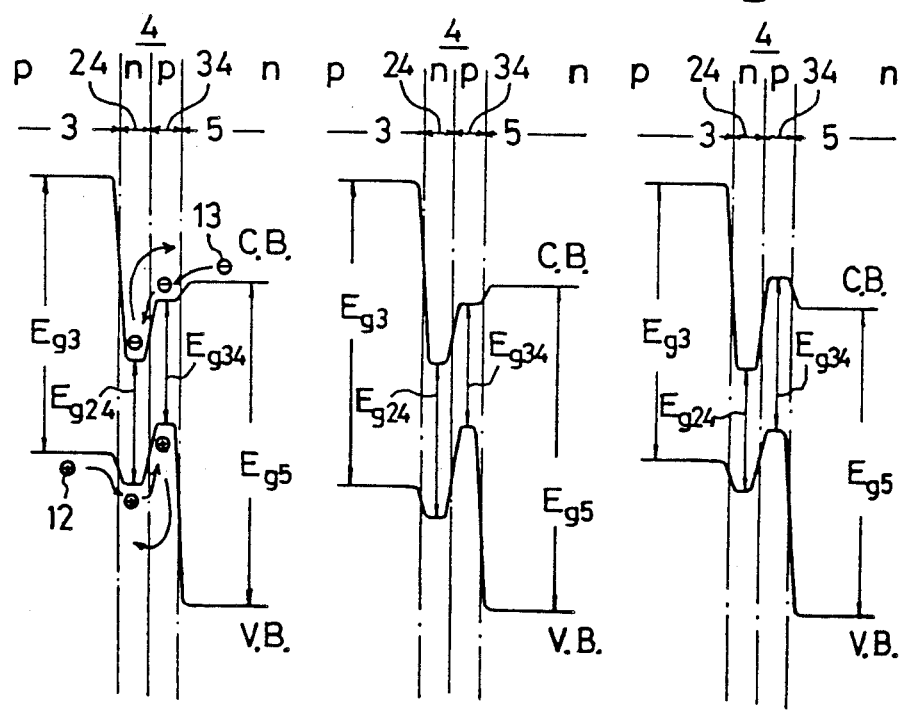
FIGS. 18A to 18C and 20A to 20C schematically show energy band structures explanatory of the ninth and tenth embodiments, respectively.
Figure 19:
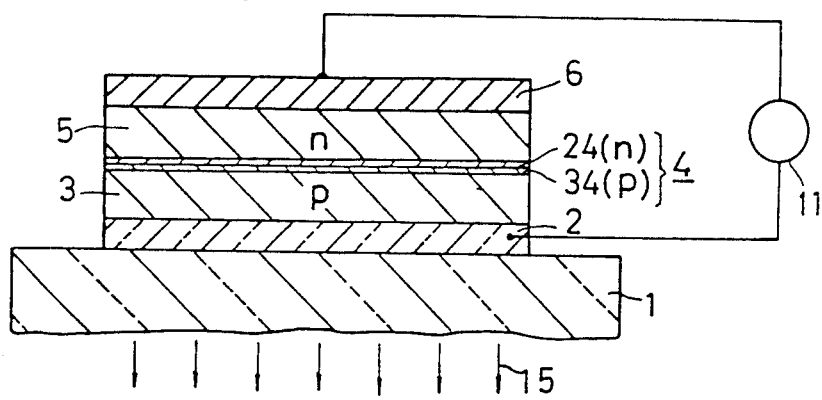
Figures 20A, 20B, 20C:
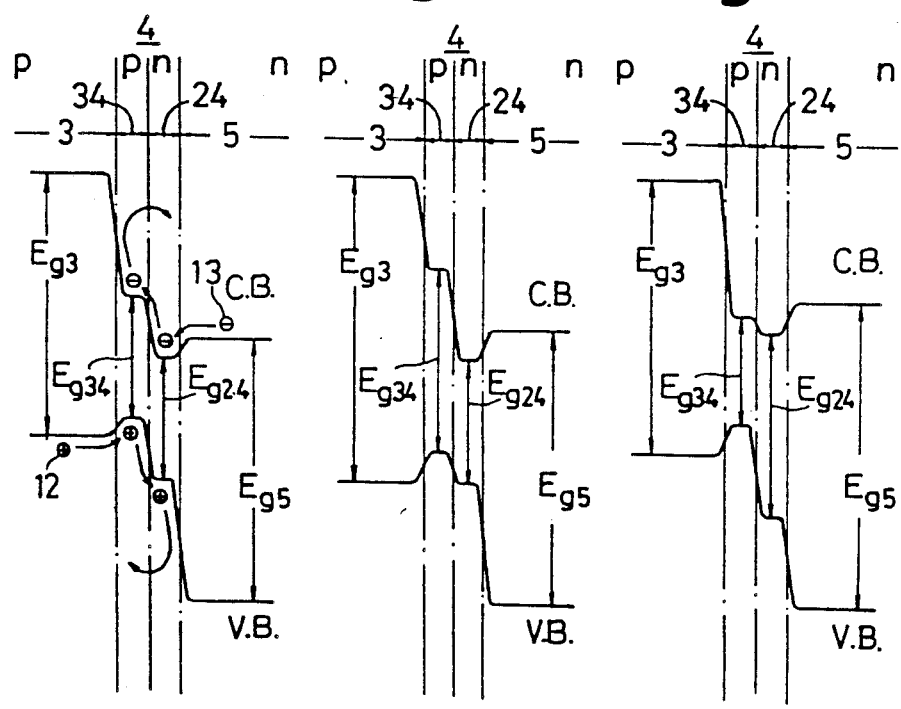

FIGS. 17 and 19 illustrate ninth and tenth embodiments of the present invention, which are identical in construction with the embodiment of FIG. 1 except that the semiconductor layer 4 is formed by the lamination of the n type semiconductor layer 24 described previously in respect of FIG. 3 and the p type semiconductor layer 34 described previously in respect of FIG. 5. In this case, however, the energy gaps $Eg_{24}$ and $Eg_{34}$ of the semiconductors of the layers 24 and 34 may be equal to or different from each other as shown in FIGS. 18A, B and C and FIGS. 20A, B and C. In FIG. 17, the layer 24 is shown to be formed on the side of the layer 3 and, in FIG. 19, it is shown to be formed on the side of the layer 5.

With the embodiments of FIGS. 17 and 19, the radiative recombination of carriers occurs in the semiconductor layers 24 and 34 as is the case with FIGS. 3 and 5, emitting light though not described in detail. In this case, if the energy gaps $Eg_{24}$ and $Eg_{34}$ of the semiconductor of the layers 24 and 34 are different from each other, lights of two different wavelengths are combined into a composite light.

Figure 21:
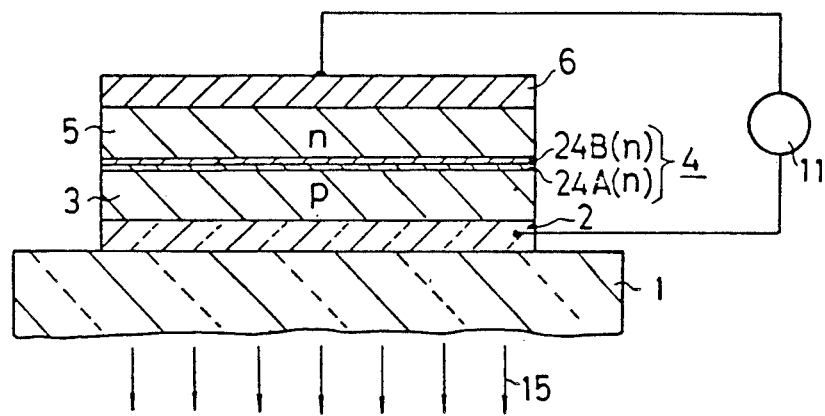
FIG. 21 is an enlarged sectional view schematically illustrating an eleventh embodiment of the present invention.
Figure 22A:
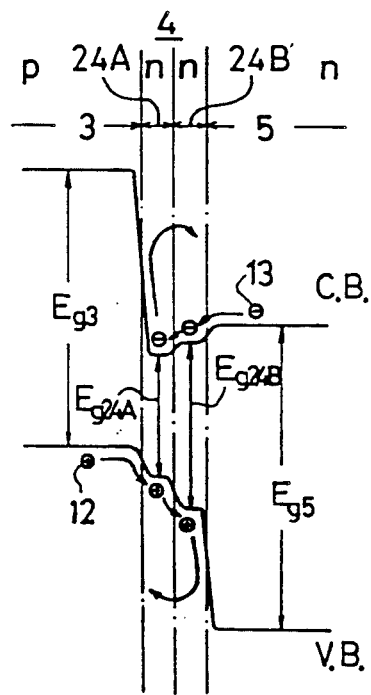
FIG. 22A to 22B schematically shows an energy band structure explanatory of the eleventh embodiment.
Figure 22B:
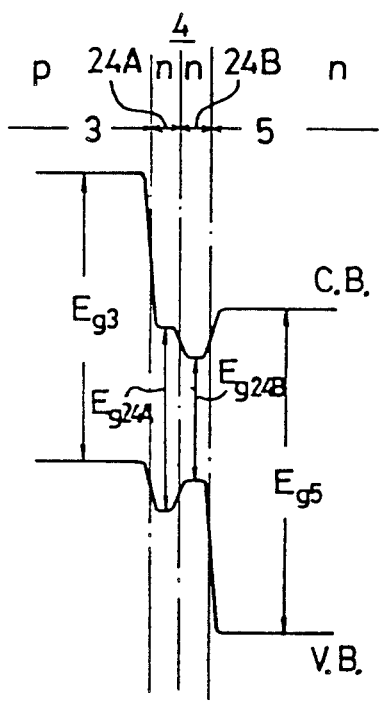

FIG. 21 illustrates an eleventh embodiment of the present invention in which the parts corresponding to those in FIG. 1 are identified by the same reference numerals and no detailed description will be repeated. This embodiment is identical in construction with the embodiment of FIG. 1 except that the non-single-crystal semiconductor layer 4 is made up of two n type non-single-crystal semiconductor layers 24A and 24B formed one on the other. In this case, the semiconductors of the layers 24A and 24B are the same as that of the layer 24 in FIG. 3 and have different energy gaps $Eg_{24A}$ and $Eg_{24B}$ as shown in FIGS. 22A and 22B. As this embodiment is identical in construction with the embodiment of FIG. 1 except the above, the radiative recombination of carriers occurs in the semiconductor layer 4, i.e. the layers 24A and 24B, emitting light, though not described in detail. In this case, however, the light thus produced is a combination of lights of different wavelengths because the energy gaps $Eg_{24A}$ and $Eg_{24B}$ of the semiconductors of the layers 24A and 24B are different.

Figure 23:
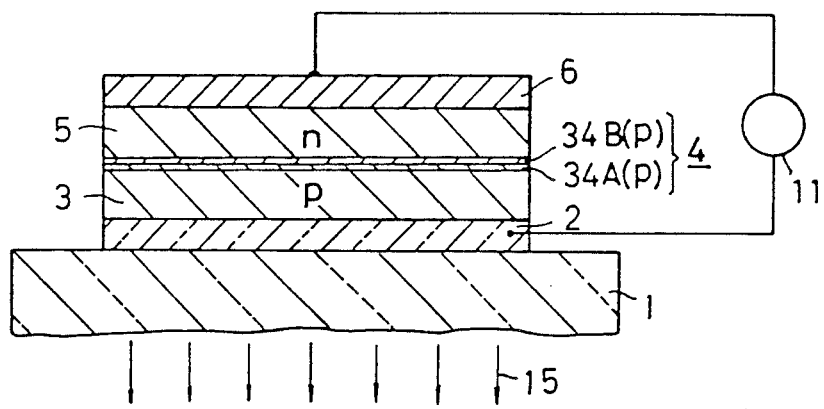
FIG. 23 is an enlarged sectional view schematically illustrating a twelfth embodiment of the present invention.
Figure 24A:
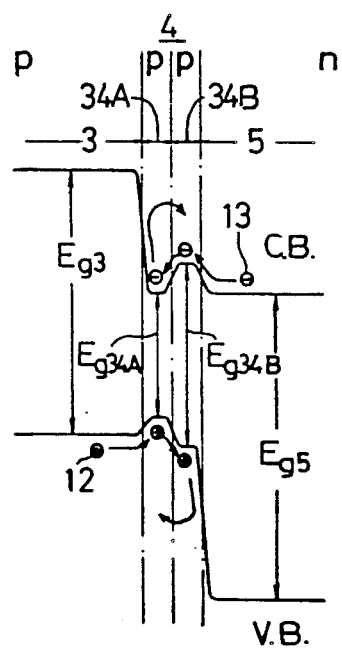
FIG. 24A to 24B schematically shows an energy band structure explanatory of the twelfth embodiment.
Figure 24B:
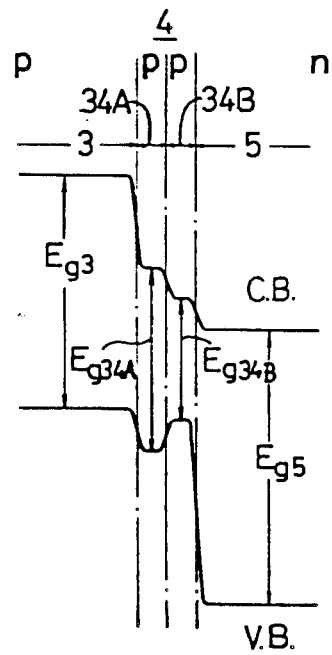

FIG. 23 illustrates a twelfth embodiment of the present invention, in which the parts corresponding to those in FIG. 1 are identified by the same reference numerals and no detailed description will be repeated. This embodiment is identical in construction with the embodiment of FIG. 1 except that the non-single-crystal semiconductor layer 4 is made up of two p type non-single-crystal semiconductor layers 34A and 34B formed one on the other. In this case, the semiconductor layers of the layers 34A and 34B are the same as that of the layer 34 in FIG. 5 and have different energy gaps $Eg_{34A}$ and $Eg_{34B}$ as shown in FIGS. 24A and 24B.

As this embodiment is identical in construction with the embodiment of FIG. 1 except the above, the radiative recombination of carriers occurs in the semiconductor layer 4, i.e. the layers 34A and 34B, emitting light, though not described in detail. In this case, however, the light thus produced is a combination of lights of different wavelengths because the energy gaps $Eg_{34A}$ and $Eg_{34B}$ of the semiconductors of the layers 34A and 34B are different.

Figure 25:
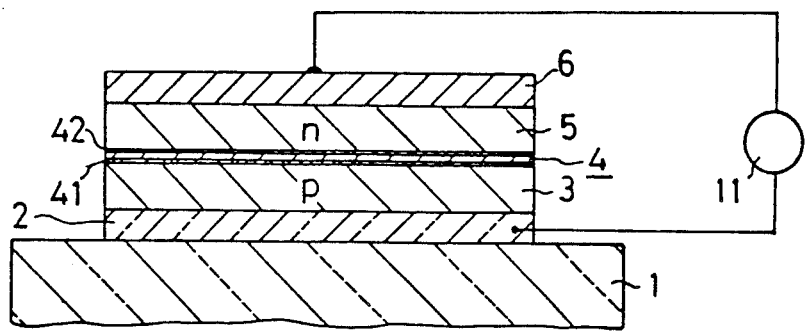
FIGS. 25 and 26 are enlarged sectional views schematically illustrating thirteenth and fourteenth embodiments of the present invention, respectively.

FIG. 25 illustrates as thirteenth embodiment of the present invention, in which the parts corresponding to those in FIG. 1, 3 or 5 are identified by the same reference numerals and no detailed description will be repeated. This embodiment is identical in construction with the embodiment of FIG. 1, 3 or 5 except that insulating or semi-insulating layers 41 and 42, which are thin enough to permit the passage therethrough of current (as a tunnel current), are sandwiched between the layers 3 and 4 and between the layers 4 and 5, respectively.

The insulating or semi-insulating layers 41 and 42 may be as a silicon nitride. The layer 41 can be formed after the formation of the layer 3 and the layer 42 can be formed after the formation of the layer 4.

Since the embodiment of FIG. 25 is identical in construction with the embodiment of FIG. 1, 3 or 5 except that the abovesaid matter, and since the insulating or semi-insulating layers 41 and 42 permits the passage therethrough of current, the same results as those obtainable with the embodiment of FIG. 1, 3 or 5 can be obtained, though not described in detail.

In this case, however, the presence of the insulating or semi-insulating layers 41 and 42 clearly defines the surfaces of the layers 3 and 4 on the side of the layers 4 and 3, respectively, and the surfaces of the layers 4 and 5 on the sides of layers 5 and 4, respectively. This ensures to provide excellent characteristics as compared with those in the case of FIG. 1, 3 or 5.

Figure 26:
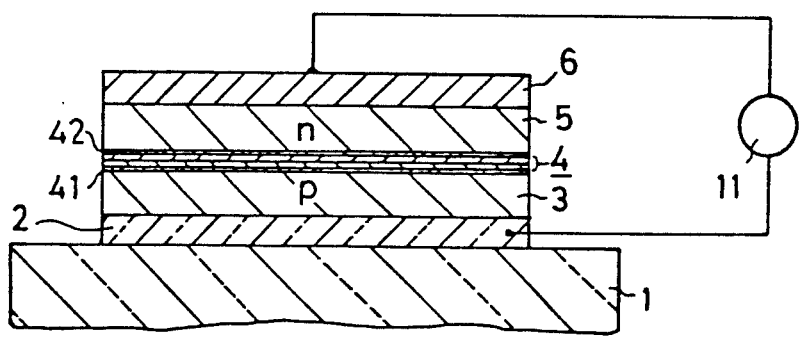

FIG. 26 illustrates a fourteenth embodiment of the present invention, which is identical in construction with the embodiment of FIG. 7, 9, 11, 13, 15, 17, 19, 21 or 23 except that the same insulating or semi-insulating layers 41 and 42 as those described above in respect of FIG. 25 are interposed between the layers 3 and 4 and between the layers 4 and 5, respectively, in the embodiment of FIG. 7, 9, 11, 13, 15, 17, 19, 21 or 23.

As this embodiment is identical in construction with the embodiment of FIG. 7, 9, 11, 13, 15, 17, 19, 21 or 23 except the above, it is possible to obtain the same operational effects as those obtainable with such an embodiment and the same feature as described previously in connection with FIG. 25.

Figure 27:
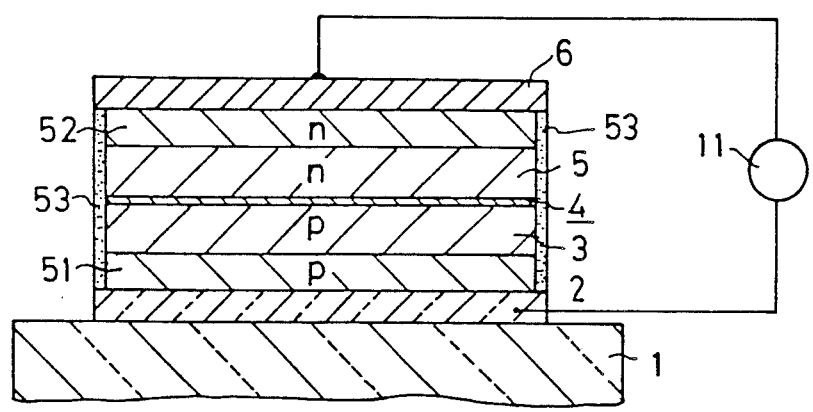
FIGS. 27, 28, 29 and 30 are enlarged sectional views schematically illustrating fifteenth, sixteenth, seventeenth and eighteenth embodiments of the present invention, respectively.

FIG. 27 illustrates a fifteenth embodiment of the present invention, which is identical in construction with the embodiment of FIG. 1, 3 or 5 except the following point. That is to say, non-single-crystal semiconductor layers 51 and 52 are interposed between the transparent electrode 2 and the semiconductor layer 3 and between the semiconductor layer 5 and the electrode 6, respectively. It is preferred that the layers 51 and 52 be formed of the same semiconductor as those of the layers 3 and 5. The semiconductors of the layers 51 and 52 are doped with the dangling bond and the recombination center neutralizer as is the case with the layers 3, 4 and 5. The layers 51 and 52 have the same conductivity type as the layers 3 and 5 respectively and are higher in impurity concentration than them. It is preferable that the energy gaps of the semiconductors of the layers 51 and 52 be larger than those of the layers 3 and 5, respectively.

The exterior surfaces of the layers 3, 4, 5, 51 and 52 are covered with an insulating film 53. The insulating film 53 may be as of a semiconductor oxide such as silicon oxide, a semiconductor nitride such as silicon nitride or a semiconductor carbide such as silicon carbide.

This embodiment produces the same effects as those obtainable with the embodiment of FIG. 1, 3 or 5, though not described in detail, because this embodiment is identical in construction with the embodiment of FIG. 1, 3 or 5 except the abovesaid matter.

In this case, the layers 51 and 52 make excellent ohmic contact with the electrodes 2 and 6, respectively, as compared with the ohmic contact of the layers 3 and 5 with electrodes 2 and 6. Accordingly, the layers 3 and 5 are electrically connected to the electrodes 2 and 6, respectively, with certainty. Further, the insulating layer 53 protects the layers 3, 4, 5, 51 and 52 and prevents leakage current between the junctions between the layers 3 and 4 and between the layers 4 and 5 due to contamination. In addition, the insulating layer 53 can be used as a light reflecting film, too. Therefore, this embodiment exhibits excellent characteristics as compared with the embodiment of FIG. 1, 3, or 5.

Figure 28:
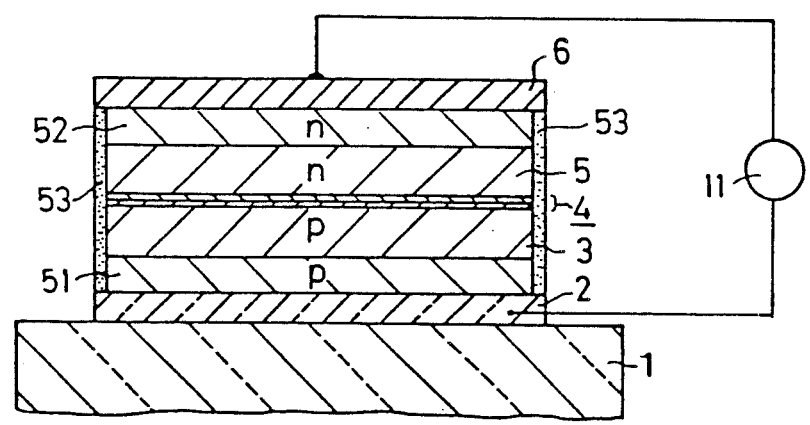

FIG. 28 illustrates a sixteenth embodiment of the present invention, which is identical in construction with the embodiment of FIG. 7, 9, 11, 13, 15, 17, 19, 21 or 23 except that the same semiconductor layers 51 and 52 as those in FIG. 27 are sandwiched between the electrode 2 and the semiconductor layer 3 and between the semiconductor layer 5 and the electrode 6, respectively, as in the case of FIG. 27, and that the exterior surfaces of the semiconductor layers 3, 4, 5, 51 and 52 are covered with the insulating film 53.

Accordingly, this embodiment, though not described in detail, possesses the same operational effects as those obtainable with the embodiment of FIG. 7, 9, 11, 13, 15, 17, 19, 21 or 23 and the same feature as that described above in respect of FIG. 27.

Figure 29:
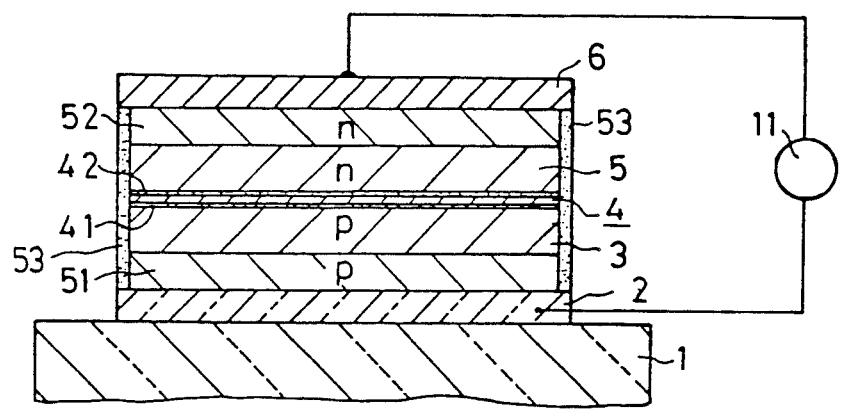
Figure 30:
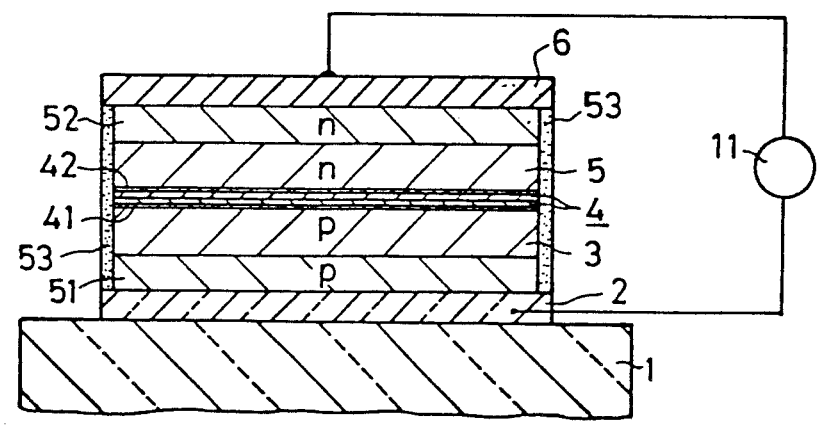

FIG. 29 and 30 respectively illustrate seventeenth and eighteenth embodiments of the present invention, in which the parts corresponding to those in FIGS. 27 and 28 are identified by the same reference numerals and no detailed description will be repeated. These embodiments are identical in construction with the embodiments of FIGS. 27 and 28 except that the insulating or semi-insulating layers 41 and 42 are interposed between the layers 3 and 4 and between the layers 4 and 5, respectively, as in the cases of FIGS. 25 and 26.

Therefore, these embodiments, though not described in detail, possess the same excellent characteristics as those described above with regard to FIGS. 27 and 28 and the same excellent features as those described previously in respect of FIGS. 25 and 26.

Figure 31:
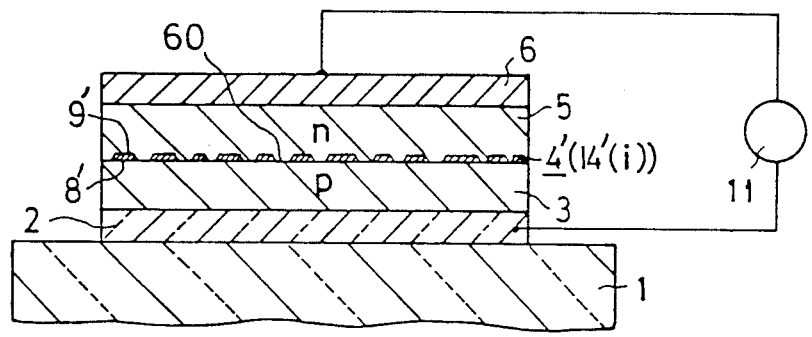
FIGS. 31, 32, 33 and 34 are enlarged sectional views schematically illustrating nineteenth, twentieth, twenty-first and twenty-second embodiments of the present invention, respectively.

FIG. 31 illustrates a nineteenth embodiment of the present invention, in which the parts corresponding to those in FIG. 1 are identified by the same reference numerals and no detailed description will be repeated. This embodiment is identical in construction with the embodiment of FIG. 1 except in the following point: In FIG. 1, the non-single-crystal semiconductor layer 4 is constituted by the i type semiconductor layer 14 and the layer 14 extends all over the p type layer 3, so that the n type layer 5 is formed on the layer 4 without making contact with the layer 3. In this embodiment, however, many layers similar to the layer 4 are formed on the layer 3 as indicated by 4' and consequently the layer 5 is formed on the layer 3 as indicated by 4' and consequently the layer 5 is formed on the layer 3 in such a manner that the layers 4' are buried in the layer 5. In this case, the layers 4' are constituted by one group of i type semiconductor layers 14' similar to the layer 14. Each of the layers 14' forms a pi junction 8' between it and the layer 3 and an ni junction 9' between it and the layer 5 as is the case with the layer 14. The semiconductor layer 5 makes direct contact with the semiconductor layer 3 at those areas where the layers 4' are not formed; accordingly, many pn junctions 60 are formed between the semiconductor layers 3 and 5.

The light emitting semiconductor device of FIG. 31 has such a construction that the many pin junction structures by the semiconductor layers 3, 14' and 5 and the many pn junction structures by the semiconductor layers 3 and 5 are arranged side by side. Connecting across the electrodes 2 and 6 the bias power source 11 which is forward with respect to the pin junction structures and the pn junction structures, radiative recombination of carriers tends to occur in the semiconductor layer 14' in the pin junction structure as in the case of FIG. 1 and radiative recombination of carriers tends to occur in the semiconductor layer 3 or 5 in the vicinity of the pn junction 60 as in the case of an ordinary pn junction structure. In the case of the pin junction structures, however, the semiconductor of the semiconductor layer 14 has a smaller energy gap than does the semiconductor of the semiconductor layer 3 or 5 and at least holes or electrons are apt to be accumulated in the semiconductor layer 14', so that the carrier recombination in the semiconductor layer 14' of the pin junction structure readily occurs as compared with the carrier recombination in the semiconductor layer 3 or 5 of the pn junction structure in the vicinity of the pn junction 60. Once the carrier recombination has been caused in the semiconductor layer 14' of the pin junction structure, carriers in the semiconductor layer 3 or 5 of the pn junction structure in the vicinity of the pn junction 60 flow into the semiconductor layer 14' of the pin junction structure in such a manner as to make up for carriers in the semiconductor layer 14' of the pin junction. As a result of this, radiative recombination of carriers occurs mainly in the semiconductor layer 14' of the pin junction structure, emitting light from the semiconductor layer 4' as in the case of FIG. 1.

Figure 32:
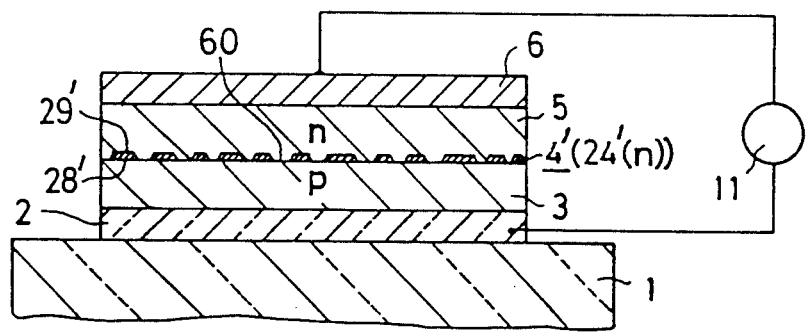

FIG. 32 illustrates a twentieth embodiment of the light emitting semiconductor device of the present invention, in which the parts corresponding to those in FIG. 31 are identified by the same reference numerals and no detailed description will be repeated. This embodiment is identical in construction with the embodiment of FIG. 31 except that the i type layer 14' forming each of the semiconductor layers 4' and the latter is replaced with the same n type layer 24' as that 24 employed in the embodiment of FIG. 3. Accordingly, many pn junctions 28' are formed between the semiconductor layer 3 and the many semiconductor layers 24' and many nn junctions 29' are formed between the many semiconductor layers 24' and the semiconductor layer 5. Further, as in the case of FIG. 32, many pn junctions 60 are formed between the semiconductor layers 3 and 5, as in the case of FIG. 31.

In the light emitting semiconductor device of FIG. 32, many pn junction structures by the semiconductor layers 3, 24' and 5 and many pn junction structures by the semiconductor layers 3 and 5 are arranged side by side. Connecting across the electrodes 2 and 6 the bias power source 11 which is forward with respect to the pn junction structures, radiative recombination of carriers tends to occur in the semiconductor layer 24' in the pn junction structure by the semiconductor layers 3, 24' and 5 as in the case of FIG. 31, and radiative recombination of carriers tends to occur, as in the case of an ordinary pn junction structure, in the semiconductor layer 3 or 5 in the pn junction structure by the semiconductor layers 3 and 5 in the vicinity of the pn junction 60. But in the case of the pn junction structure by the semiconductor layers 3, 24' and 5, since the semiconductor of the layer 24' has a smaller energy gap than does the semiconductor of the layer 3 or 5 as in the case of FIG. 31, the carrier recombination readily occurs as compared with that in the pn junction structure by the semiconductor layers 3 and 5. Once the carrier recombination has been caused in the semiconductor layer 24' of the pn junction structure by the semiconductor layers 3, 24' and 5, carriers in the pn junction structure by the semiconductor layers 3 and 5 flow out therefrom into the semiconductor layer 24'. In consequence, radiative recombination of carriers occur mainly in the semiconductor layer 24', emitting therefrom light.

Figure 33:
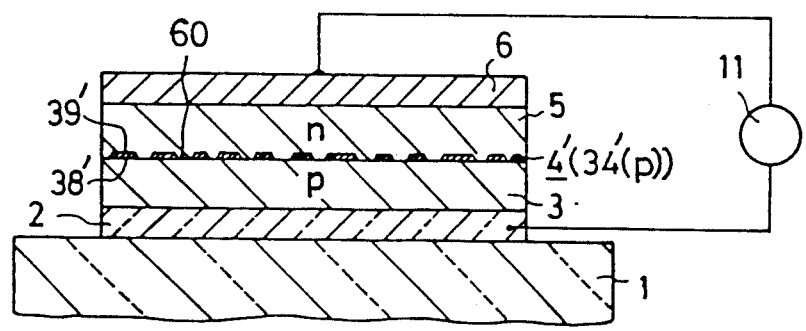

FIG. 33 illustrates a twenty-first embodiment of the light emitting semiconductor device of the present invention, in which the parts corresponding to those in FIG. 31 are identified by the same reference numerals and no detailed description will be repeated. This embodiment is identical in construction with the embodiment of FIG. 31 except that the I type layer 14' forming each of the semiconductor layers 4' in the latter is replaced with the same p type layer 34' as that 34 employed in the embodiment of FIG. 5. Accordingly, many pp junctions 38' are formed between the semiconductor layer 3 and the many semiconductor layers 34' and many pn junctions 39' are formed between the many semiconductor layers 34' and the semiconductor layer 5. Further, as in the case of FIG. 33, many pn junctions 60 are formed between the semiconductor layers 3 and 5, as in the case of FIG. 31.

In the light emitting semiconductor device of FIG. 33, many pn junction structures by the semiconductor layers 3, 34' and 5 and many pn junction structures by the semiconductor layers 3 and 5 are arranged side by side. Connecting across the electrodes 2 and 6 the bias power source 11 which is forward with respect to the pn junction structures, radiative recombination of carriers occurs mainly in the semiconductor layer 34' to emit therefrom light as in the case of FIG. 31, though not described in detail.

Figure 34:
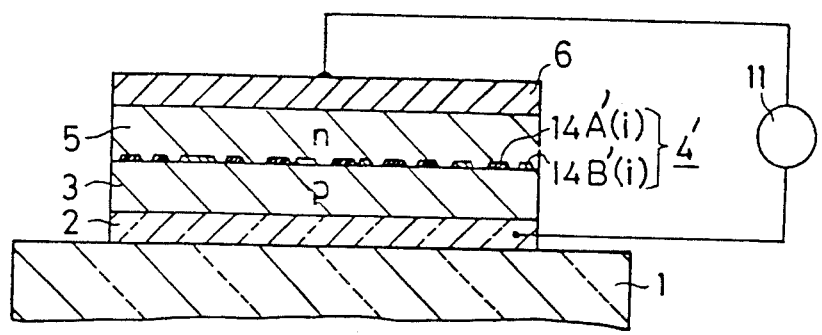

FIG. 34 illustrates a twenty-second embodiment of the present invention, in which the parts corresponding to those in FIG. 31 are identified by the same reference numerals. This embodiment is identical in construction with the embodiment of FIG. 31 except that the layer 4' is formed by a first combination of a first group of i type semiconductor layers 14A' similar to those 14' referred to previously in respect of FIG. 31 and a second group of i type semiconductor layers 14B' similar to those 14' but different in energy gap from the layers 14A', a second combination of a first group of the i type semiconductor layer 14' and a second group of the n type semiconductors layers 24' described previously in connection with FIG. 32, a third combination of a first group of the i type semiconductor layers 14' and a second group of the p type semiconductor layers 34' mentioned previously with respect to FIG. 33, a fourth combination of a first group of the n type semiconductor layers 24' and a second group of the p type semiconductor layers 34', a fifth combination of a first group of n type semiconductor layers 24A' similar to those 24' and a second group of n type semiconductor layers 24B' similar to those 24', or a sixth combination of a first group of p type semiconductor layers 34A' similar to those 34' and a second group of p type semiconductor layers 34B' similar to those 34'. FIG. 34 shows for the sake of simplicity, the case of the abovesaid first combination. In the cases of the first, fifth and sixth combinations, the semiconductors of the first and second groups have different energy gaps. In the cases of the second, third and fourth combinations, it does not matter whether the semiconductors of the first and second groups have the same energy gap or not.

With the embodiment of FIG. 34 which has the abovesaid arrangement, though not described in detail, it is possible to obtain the same operational effects as in the embodiments of FIGS. 31 to 33 and the excellent features referred to previously in respect of FIGS. 7, 9, 11, 13, 15, 17, 19, 21 or 23.

Figure 35:
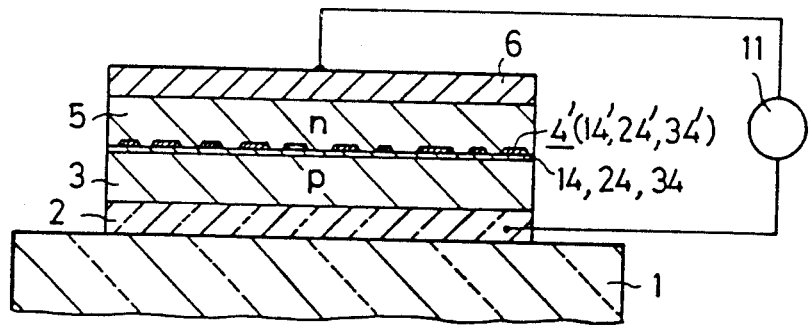
FIGS. 35, 36, 37 and 38 are enlarged sectional views schematically illustrating twenty-third, twenty-fourth, twenty-fifth and twenty-sixth embodiments of the present invention, respectively.

FIG. 35 illustrates a twenty-third embodiment of the present invention, in which the parts corresponding to those in FIG. 1 are identified by the same reference numerals, and no detailed description will be repeated. This embodiment is identical in construction with the embodiment of FIG. 1 except in the following point.

On the layer 3 is formed the same i type layer 14 as in the case of FIG. 1, the same n type layer 24 as in the case of FIG. 3 or the same p type layer 34 as in the case of FIG. 5. Further, there are formed on the layer 14, 24 or 34 many semiconductor layers 4' similar to those used in FIGS. 31, 32 or 33. On the layer 14, 24 or 34 is formed the layer 5 in a manner to bury therein the layers 4'.

In this embodiment, since its construction is a combination of the embodiment of FIGS. 1, 3 or 5 and the embodiment of FIGS. 31, 32 or 33, it is possible to obtain the same effects as those obtainable with the embodiments of FIGS. 1, 3 or 5 and FIGS. 31, 32 or 33, though not described in detail.

Figure 36:
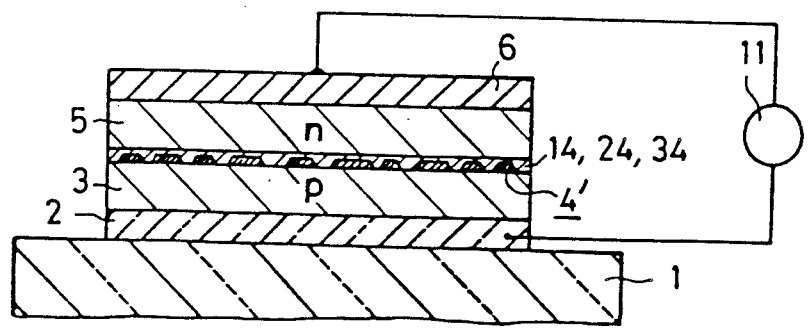

FIG. 36 illustrates a twenty-fourth embodiment of the present invention, in which the parts corresponding to those in FIG. 1 are identified by the same reference numerals, and no detailed description will be repeated.

On the layer 3 are formed many semiconductor layers 4' similar to those used in FIGS. 31, 32 or 33. The layer 3 is covered with the same i type, n type or p type layer 14, 24 or 34 as that in FIGS. 1, 3 or 5 to bury therein the layers 4. The layer 5 is formed on the layer 14, 24 or 34.

This embodiment is constructed by a combination of the embodiment of FIGS. 1, 3 or 5 and the embodiment of FIG. 31, 32 or 33, and hence it produces the same effects as those in the case of FIG. 35.

Figure 37:
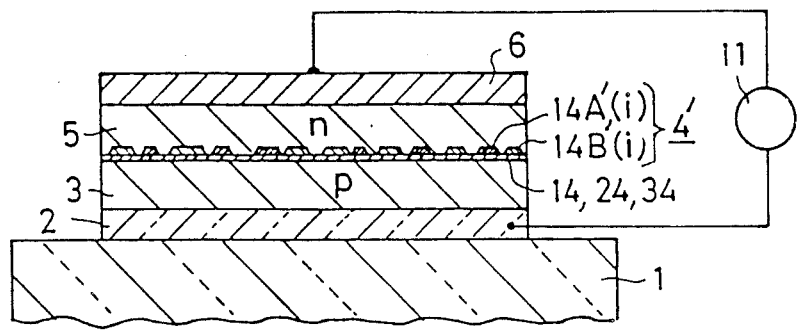
Figure 38:
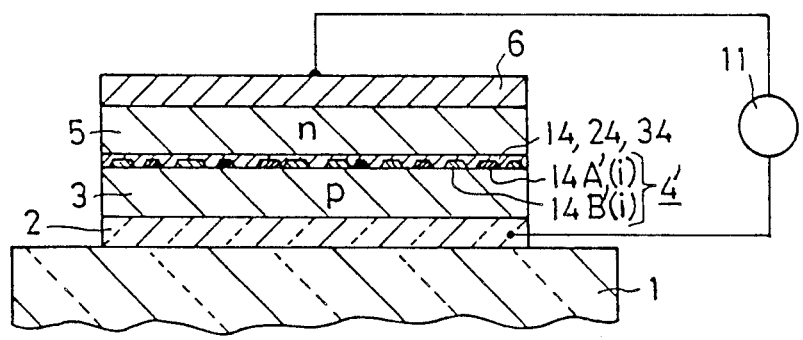

FIGS. 37 and 38 illustrate twenty-fifth and twenty-sixth embodiments of the present invention, in which the parts corresponding to those in FIGS. 35 and 36 are marked with the same reference numerals. These embodiments are identical in construction with the embodiments of FIGS. 35 and 36, respectively, except that the layer 4' is formed by the same first, second, third, fourth, fifth or sixth combination as in the case of FIG. 34.

With these embodiments, it is possible to obtain the same operational effects as those in the cases of FIGS.

35 and 36 and the same operational effect as that in the case FIG. 34, though not described in detail.

Figure 39B:
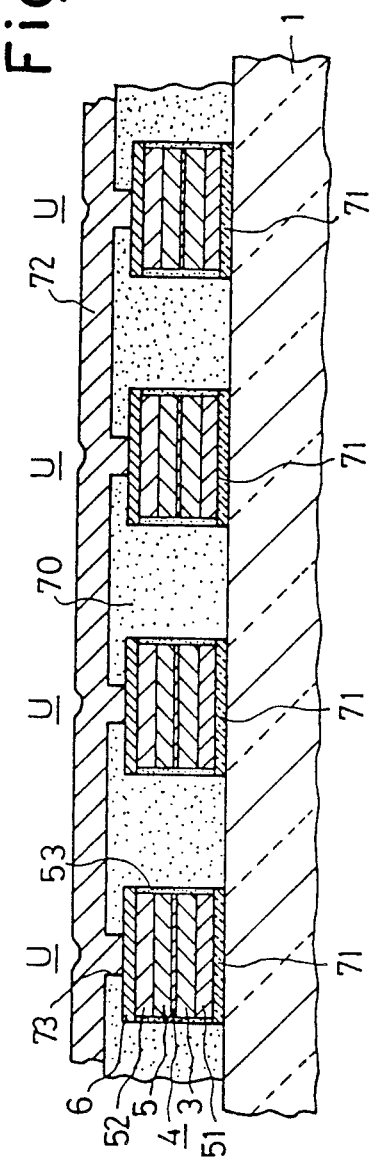
FIGS. 39B and 39C are sectional views taken on the lines B—B and C—C in FIG. 39A, respectively.
Figure 39C:
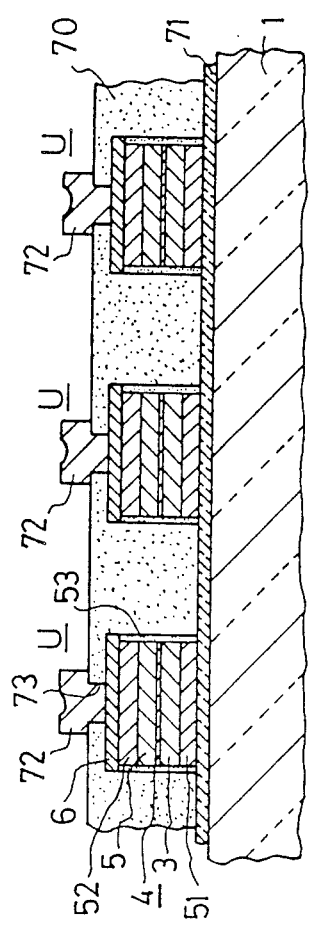

FIGS. 39A to 39C illustrate a twenty-seventh embodiment of the present invention, in which the parts corresponding to those in FIG. 27 are identified by the same reference numerals. This embodiment has the arrangement that a plurality of such light emitting semiconductor devices U as described previously in respect of FIG. 27 are arranged in a matrix form. In this case, the devices U are formed on the same substrate 1 and are covered with an insulating layer 70. The electrodes 2 of the device U arranged on each column line are replaced with column selecting, transparent stripe-like conductor layers 71 and the electrodes 6 of the devices U arranged on each row line are connected with row selecting, stripe-like conductor layers 72, on the insulating layer 70 through windows 73 formed therein.

Figure 40:
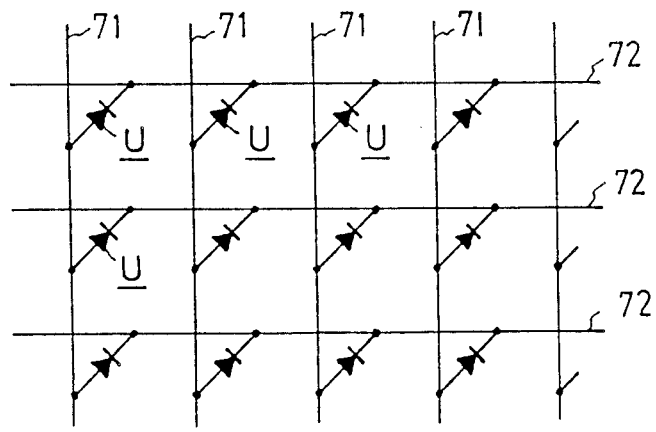
FIG. 40 is a circuit diagram of the device depicted in FIG. 39A.

This embodiment electrically constitutes a matrix circuit shown in FIG. 40, though not described in detail. Accordingly, it is possible to provide a display of a picture by suitably selecting the column selecting conductor layers 71 and the row selecting conductor layers 72.

Figure 41A:
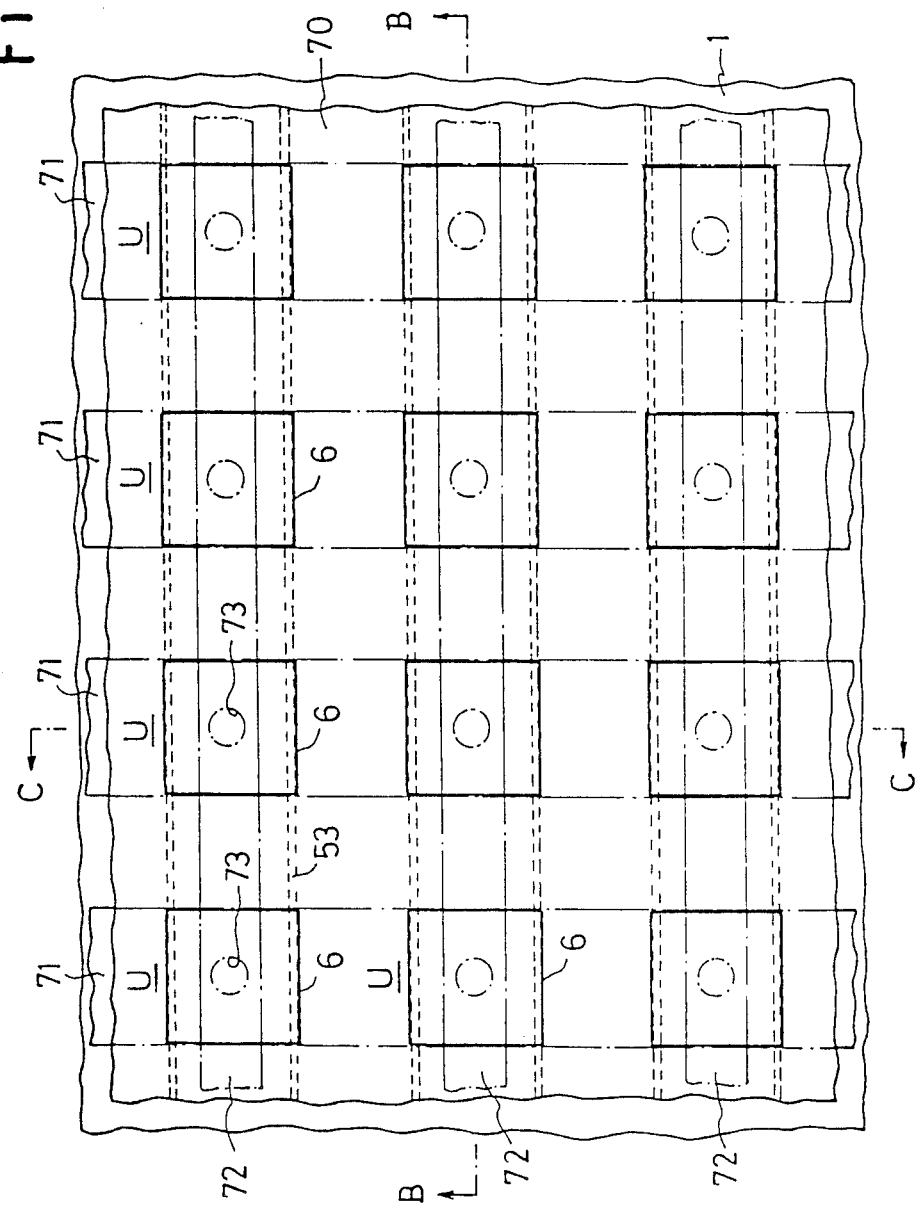
FIG. 41A is a plan view schematically illustrating a twenty-eighth embodiment of the present invention.
Figure 41B:
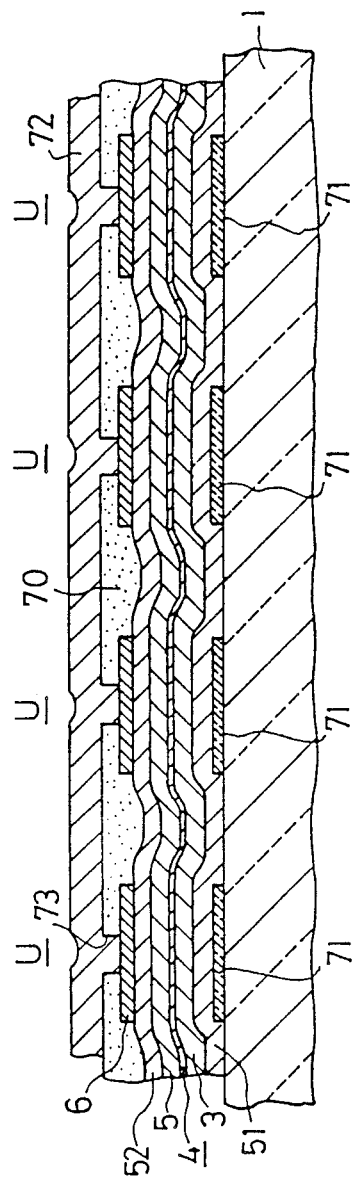
FIGS. 41B and 41C are sectional views taken on the lines B—B and C—C in FIG. 41A, respectively.
Figure 41C:
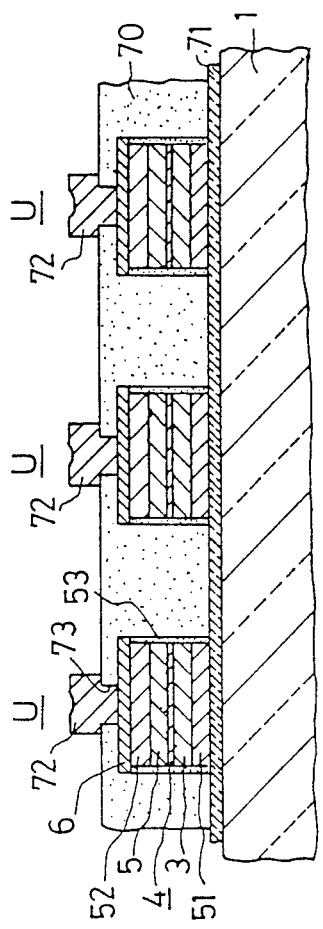

FIGS. 41A to 41C illustrate a twenty-eighth embodiment of the present invention, which is identical in construction with the embodiment of FIGS. 39A to 39C except that the semiconductor layers 3, 4, 5, 51 and 52 of the devices U arranged on each row line are coupled together. Also this embodiment has the same operational effect as that obtainable with the embodiment of FIGS. 39A to 39C, though not described in detail.

FIGS. 42A to 42C illustrate a twenty-ninth embodiment of the present invention, which is identical in construction with the embodiment of FIGS. 39A to 39C except that the semiconductor layers 3, 4, 5, 51 and 52 of the devices U arranged on each column line are coupled together. Also this embodiment has the same operational effect as that obtainable with the embodiment of FIGS. 39A to 39C, though not described in detail.

Figure 43A:
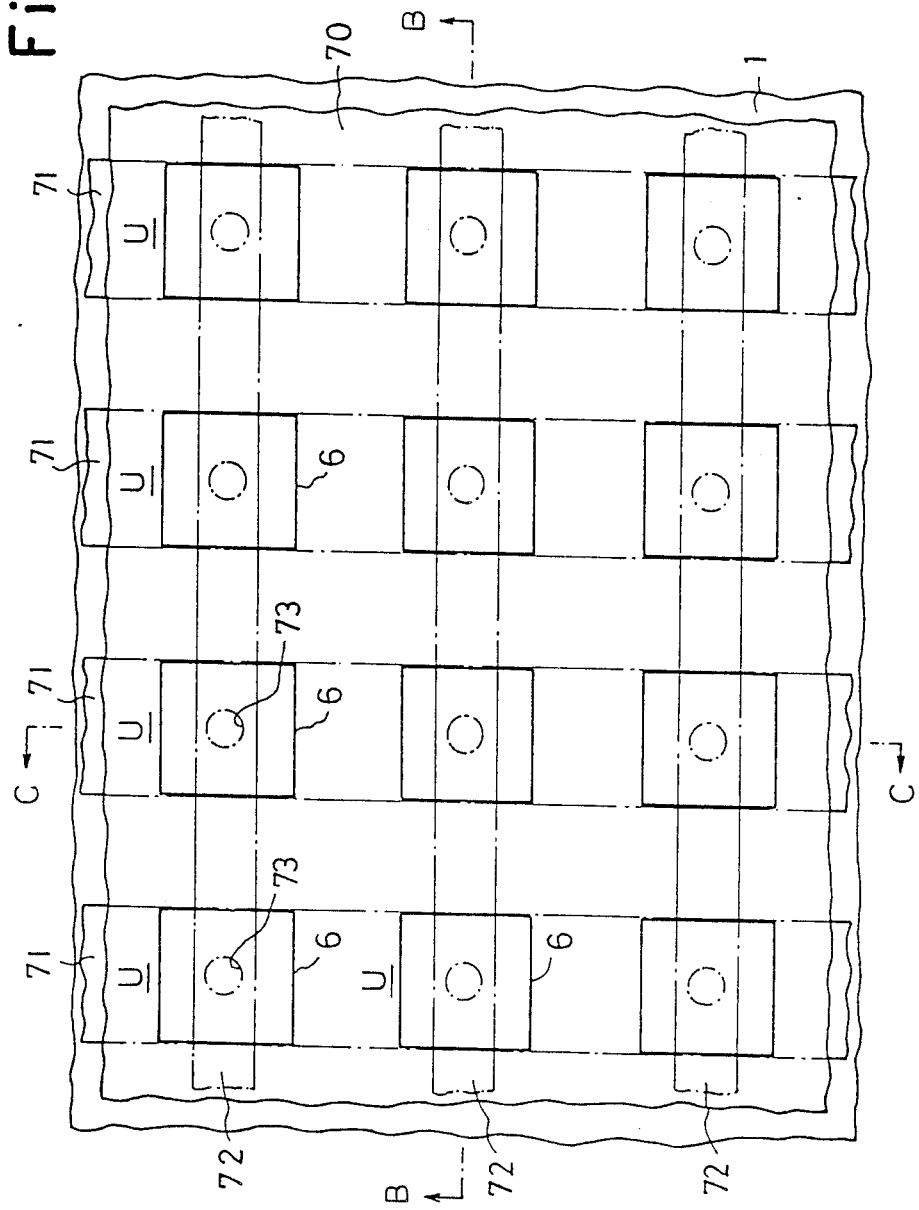
FIG. 43A is a plan view schematically illustrating a thirtieth embodiment of the present invention.

FIGS. 43A to 43C illustrate a thirtieth embodiment of the present invention, which is identical in construction with the embodiment of FIGS. 39A to 39C except that the semiconductor layers 3, 4, 5, 51 and 52 of all the devices U are coupled together. Also this embodiment has the same operational effect as those obtainable with the embodiment of FIGS. 39A to 39C, though not described in detail.

The foregoing description has been given some embodiments of the present invention. In the first to eighteenth embodiments it is also possible to dope the non-single-crystal semiconductor layer 4 with an impurity which forms the radiative carrier recombination centers, such as iron, gold or the like, thereby emitting light by virtue of the impurity level. Also in the nineteenth to twenty-second embodiments the semiconductor layer 4' can similarly be doped with an impurity that forms the radiative recombination centers.

Moreover, in the twenty-third to twenty-sixth embodiments the semiconductor layers 14, 24, 34 and 4' can each be doped with an impurity which forms the radiative recombination centers.

In the thirteenth and fourteenth embodiments of FIGS. 25 and 26 it is also possible to omit either one of the insulating or semi-insulating layers 41 and 42. In the first to fourteenth embodiments it is also possible to provide the insulating layer 53 as in the fifteenth and sixteenth embodiments of FIGS. 27 and 28. Furthermore, the same matrix structure as in the cases of FIGS. 39 to 43 can also be obtained using the light emitting semiconductor devices of the first to fourteenth and sixteenth to twenty-sixth embodiments.

It is also possible to make the transparent substrate 1 and the transparent electrode 2 opaque and the electrode 6 transparent for emitting light from the side of this electrode. Also it is possible to omit the electrode 2 and the make the substrate 1 conductive to cause it to serve as the electrode.

What is claimed is:

1. A light emitting semiconductor device comprising:
   a transparent glass substrate;
   a plurality of light emitting elements consisting of non-single-crystalline semiconductor which are in the form of a matrix;
   an insulator disposed between and in direct contact with the side surfaces of said light emitting elements and with which the spaces between said elements are completely filled; and
   a plurality of column electrode lines and a plurality of row electrode lines for addressing particular elements and causing light emission from said particular elements through said transparent glass substrate.

2. The device of claim 1 wherein side and upper surfaces of said light emitting elements are embedded in said insulator which extends on the said side and upper surfaces of said light emitting elements.

3. The device of claim 1 wherein upper and lower surfaces of said insulator are flat, said column or row lines extending over said flat surfaces.

4. The device of claim 1 where said insulator is an organic resin layer.

5. A light emitting semiconductor device of claim 1, wherein the light emitting elements comprise a first non-single crystalline semiconductor layer of a first conductivity type, a second non-single crystalline semiconductor layer formed on the first non-single crystalline semiconductor layer, and a third non-single crystalline semiconductor layer of a second conductivity type opposite to the first conductivity type, said third non-single crystalline semiconductor layer being formed on the second non-single crystalline semiconductor layer.

6. A light emitting semiconductor device of claim 5, wherein the second non-single crystalline semiconductor layer has a smaller energy band gap than the first and third non-single crystalline semiconductor layers.

7. A light emitting semiconductor device of claim 5, wherein a band gap of the second non-single crystalline semiconductor layer is equal to a band gap of the first non-single crystalline semiconductor layer and smaller than a bank gap of the third non-single crystalline semiconductor layer.

8. A light emitting semiconductor device of claim 5, wherein a band gap of the second non-single crystalline semiconductor layer is equal to a band gap of the third non-single crystalline semiconductor layer and smaller than a band gap of the first non-single crystalline semiconductor layer.

9. A light emitting semiconductor device of claim 1, wherein the light emitting elements comprise a first non-single crystalline semiconductor layer of a first conductivity type, a second and third non-single crystalline semiconductor layer formed on the first non-single crystalline semiconductor layer, and a fourth non-single crystalline semiconductor layer of a second conductivity type opposite to the first conductivity type that is formed on the third non-single crystalline semiconductor layer, wherein the second and third non-single crystalline semiconductor layers have smaller band gaps than the first and fourth non-single crystalline semiconductor semiconductor layers.

* * * * *